(12) United States Patent
Kim

(10) Patent No.: US 9,221,677 B2
(45) Date of Patent: Dec. 29, 2015

(54) COMPOSITE SACRIFICIAL STRUCTURE FOR RELIABLY CREATING A CONTACT GAP IN A MEMS SWITCH

(75) Inventor: Sangchae Kim, Irvine, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 328 days.

(21) Appl. No.: 12/973,105

(22) Filed: Dec. 20, 2010

(65) Prior Publication Data

US 2012/0156820 A1    Jun. 21, 2012

(51) Int. Cl.
| | |
|---|---|
| *H01L 21/02* | (2006.01) |
| *B81C 1/00* | (2006.01) |
| *H01H 1/00* | (2006.01) |
| *H01H 59/00* | (2006.01) |

(52) U.S. Cl.
CPC .......... *B81C 1/00626* (2013.01); *H01H 1/0036* (2013.01); *B81B 2201/014* (2013.01); *H01H 59/0009* (2013.01)

(58) Field of Classification Search
CPC ............ H01H 1/0036; H01H 59/0009; B81C 1/00626; B81C 1/0015; B81C 2203/0118; B81B 2201/014; G01P 15/0802; G01P 15/125
USPC .............. 438/52; 257/415; 333/262, 232, 105
See application file for complete search history.

(56) References Cited

U.S. PATENT DOCUMENTS

| | | | | |
|---|---|---|---|---|
| 5,638,946 | A * | 6/1997 | Zavracky ...................... 200/181 |
| 6,054,659 | A * | 4/2000 | Lee et al. ...................... 200/181 |
| 6,815,361 | B1 * | 11/2004 | Bae et al. ...................... 438/706 |
| 7,745,892 | B1 * | 6/2010 | Ivanov et al. .................. 257/415 |
| 7,754,986 | B1 * | 7/2010 | Niblock et al. ................ 200/181 |
| 7,838,321 | B2 * | 11/2010 | Nystrom et al. ................ 438/53 |
| 8,293,557 | B2 * | 10/2012 | Inoue et al. ..................... 438/50 |
| 2003/0058069 | A1 * | 3/2003 | Schwartz et al. ............... 335/78 |
| 2004/0000696 | A1 * | 1/2004 | Ma et al. ........................ 257/415 |
| 2004/0188785 | A1 * | 9/2004 | Cunningham et al. ......... 257/415 |
| 2007/0215965 | A1 * | 9/2007 | Yang et al. ..................... 257/415 |
| 2009/0160584 | A1 * | 6/2009 | Premerlani et al. ........... 333/262 |
| 2010/0314669 | A1 * | 12/2010 | Huang .......................... 257/254 |

OTHER PUBLICATIONS

Ma, Q. et al, "Metal contact reliability of RF MEMS switches," Reliability, packaging, testing, and characterization of MEMS/MOEMS Conference No. 6, Proceedings of SPIE, 2007, pp. 646305.1-646305.13, vol. 6463, SPIE.

Majumder, S. et al, "A Packaged, High-Lifetime Ohmic MEMS RF Switch," IEEE MTT-S International Microwave Symposium Digest, 2003, pp. 1935-1938, vol. 3, IEEE.

McKillop, J. et al, "Design, Performance and Qualification of RF MEMS Switches," 20th Eurosensors Conference, Sep. 17-20, 2006, T2B-P12, Teravicta Technologies.

\* cited by examiner

*Primary Examiner* — Latanya N Crawford
(74) *Attorney, Agent, or Firm* — Withrow & Terranova, P.L.L.C.

(57) ABSTRACT

The present Disclosure provides for fabrication devices and methods for manufacturing a micro-electromechanical system (MEMS) switch on a substrate. The MEMS fabrication device may have a first and second sacrificial layer that form the mold of an actuation member. The actuation member is formed over the first and second sacrificial layers to manufacture a MEMS switch from the MEMS fabrication device.

33 Claims, 22 Drawing Sheets

COMPOSITE SACRIFICIAL STRUCTURE FOR RELIABLY CREATING A CONTACT GAP IN A MEMS SWITCH

FIELD OF THE DISCLOSURE

The present Disclosure relates to methods and devices for manufacturing micro-electro-mechanical system (MEMS) switches, and in particular to forming a MEMS switch on a semiconductor substrate having more than one sacrificial layer.

BACKGROUND OF THE DISCLOSURE

FIG. 1 illustrates a MEMS switch 10 formed on a semiconductor substrate 12. The MEMS switch 10 includes an actuation member 14, such as the illustrated cantilever, which is formed from a conductive material. The actuation member 14 may have an anchored end 16, an arm 18, and a contact portion 20. The anchored end 16 is attached and electrically coupled to an anchor pad 22 defined on the semiconductor substrate 12. The contact portion 20 of the actuation member 14 forms or is provided with a contact area 24, which is suspended over another contact area 26 on a contact pad 28. The distance between the contact area 24 on the contact portion 20 of the actuation member 14 and the contact area 26 on the contact pad 28 defines a contact gap 30. To actuate the MEMS switch 10 and in particular to cause the actuation member 14 to move the contact area 24 into electrical contact with the contact area 26 of the contact pad 28, an actuator plate 32 is disposed under the arm 18 of the actuation member 14. The distance between the arm 18 and the actuator plate 32 defines an actuator gap 33.

Referring now to FIG. 2, to actuate the actuation member 14 from the open position (illustrated in FIG. 1) to the closed position, a potential is applied to the actuator plate 32 which creates an electromagnetic field. The electromagnetic field exerts a force on the actuation member 14, moving it toward the substrate 12 and thus, moves the contact area 24 on the contact portion 20 of the actuation member 14 into electrical contact with the contact area 26 of the contact pad 28 thereby electrically connecting the anchor pad 22 to the contact pad 28.

FIG. 3 and FIG. 4 illustrate a prior art method of manufacturing the MEMS switch 10 on the semiconductor substrate 12. In FIG. 3, the anchor pad 22, the contact pad 28, and the actuator plate 32 are formed on the semiconductor substrate 12 and a sacrificial layer 34 is placed and patterned over the anchor pad 22, the contact pad 28, and the actuator plate 32. This sacrificial layer 34 forms the mold for the actuation member 14 and includes a recess 36. This recess 36 is shaped to mold the contact portion 20 (illustrated in FIGS. 1 and 2) of the actuation member 14.

Next, referring to FIG. 4, the actuation member 14 is formed over the sacrificial layer 34 and the contact portion 20 is molded by the recess 36 which may also cause the top of the contact portion 20 on the actuation member 14 to have a recess 38. The recess 36 in the sacrificial layer 34 defines the size of the contact gap 30 because the depth and shape of the recess 36 determines the distance between contact area 24 and contact area 26 on the contact pad 28. Similarly, the portion of the sacrificial layer 34 between the actuator plate 32 and the arm 18 defines the size of the actuator gap 33. The sacrificial layer 34 is etched away to form the MEMS switch 10 illustrated in FIG. 1.

Unfortunately, it is difficult to precisely control the shape and depth of recess 36 formed in the sacrificial layer 34. This results in unacceptably high variations in the size of the contact gaps 30 among MEMS switches 10 manufactured in accordance with the prior art method. These variations can reduce the life and performance of the MEMS switch. For example, if the contact gap in the MEMS switch is too small, an excessive amount of force is placed on the contact areas 24, 26 thereby reducing the overall life of the MEMS switch 10. On the other hand, if the contact gap is too large, the contact areas 24, 26 may not properly close the MEMS switch. Another disadvantage of the prior art method is that the recess 36 often is not sufficiently planar thereby causing the contact area 24 on the actuation member 14 to be formed with a low degree of planarization. Also, the sacrificial layer 34 is generally a polymer based sacrificial layer that leaves carbon based contaminants on the contact areas 24, 26. Low degrees of planarization in the contact area 24 of the actuation member 14 and carbon based contaminants can increase the contact resistance and reduce the performance of the MEMS switch 10.

Thus, what is needed are methods and devices for manufacturing MEMS switches that can more easily control and thereby reduce variations in the size of the contact gap. In addition, methods and devices are needed which can provide a higher degree of planarization in the contact area of the actuation member and reduce carbon based contamination in the contact areas of the MEMS switch.

SUMMARY OF THE DISCLOSURE

The present Disclosure relates generally to fabrication devices and methods of manufacturing MEMS switches. More specifically, the fabrication devices and methods disclosed herein can reduce the variation in the size of the contact gaps among manufactured MEMS switches. Also, these fabrication devices and methods can reduce contamination and provide a higher degree of planarization in the contact areas of the MEMS switches. Consequently, MEMS switches manufactured utilizing the fabrication devices and methods disclosed herein may have longer lives and increased performance.

In one embodiment, MEMS fabrication devices are formed on a substrate which, for example, may be a complementary metal-oxide semiconductor wafer (CMOS). An actuator plate and a contact pad for the MEMS switch are provided over the substrate. To create the actuation member, a first sacrificial layer is placed on the contact pad of the MEMS fabrication device and a second sacrificial layer may be formed over the actuator plate and contact pad. The second sacrificial layer is patterned to define a recess that exposes an area of the first sacrificial layer. The MEMS fabrication device may then be electroplated to form the actuation member over the first and second sacrificial layers. This recess in the second conductive layer molds the contact portion of the actuation member. The first sacrificial layer and the second sacrificial layer are then developed and removed to create a MEMS switch.

Those skilled in the art will appreciate the scope of the present Disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the Disclosure, and together with the description serve to explain the principles of the Disclosure.

DETAILED DESCRIPTION OF THE PREFERRED EMBODIMENTS

The embodiments set forth below represent the necessary information to enable those skilled in the art to practice the Disclosure and illustrate the best mode of practicing the Disclosure. Upon reading the following description in light of the accompanying drawing figures, those skilled in the art will understand the concepts of the Disclosure and will recognize applications of these concepts not particularly addressed herein. It should be understood that these concepts and applications fall within the scope of the disclosure and the accompanying claims.

Figure 1:
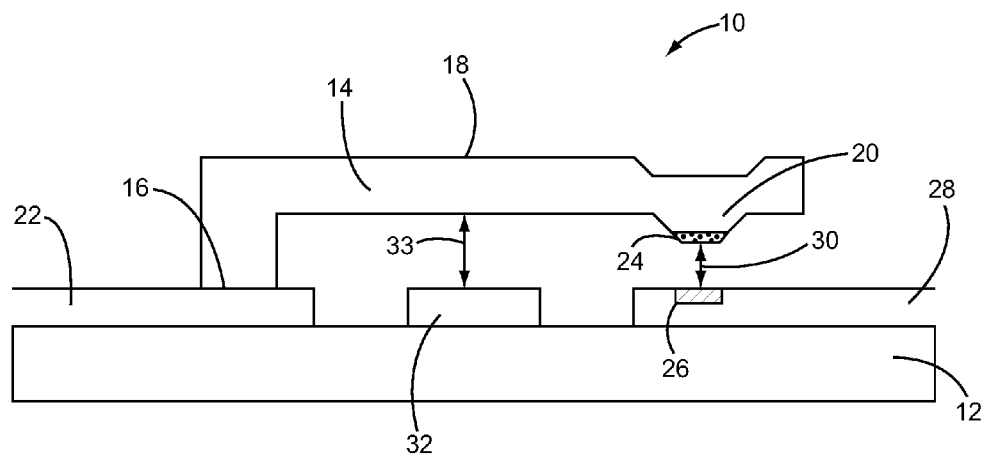
FIG. 1 is a cross sectional view of an exemplary MEMS switch which has been manufactured in accordance with a prior art method and is in an open position.
Figure 2:
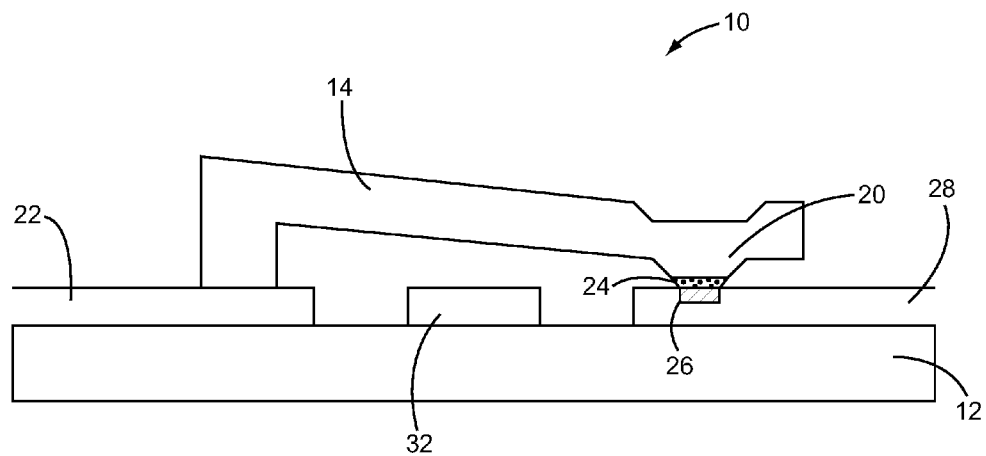
FIG. 2 is a cross sectional view of the exemplary micro-MEMS switch in a closed position.
Figure 3:
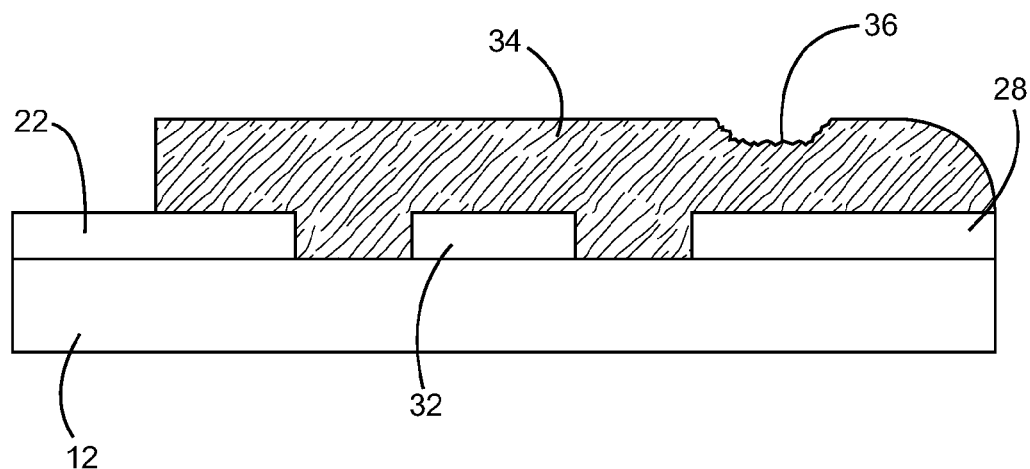
FIGS. 3 and 4 illustrate steps in manufacturing the MEMS switch illustrated in FIGS. 1 and 2 utilizing a prior art method.
Figure 4:
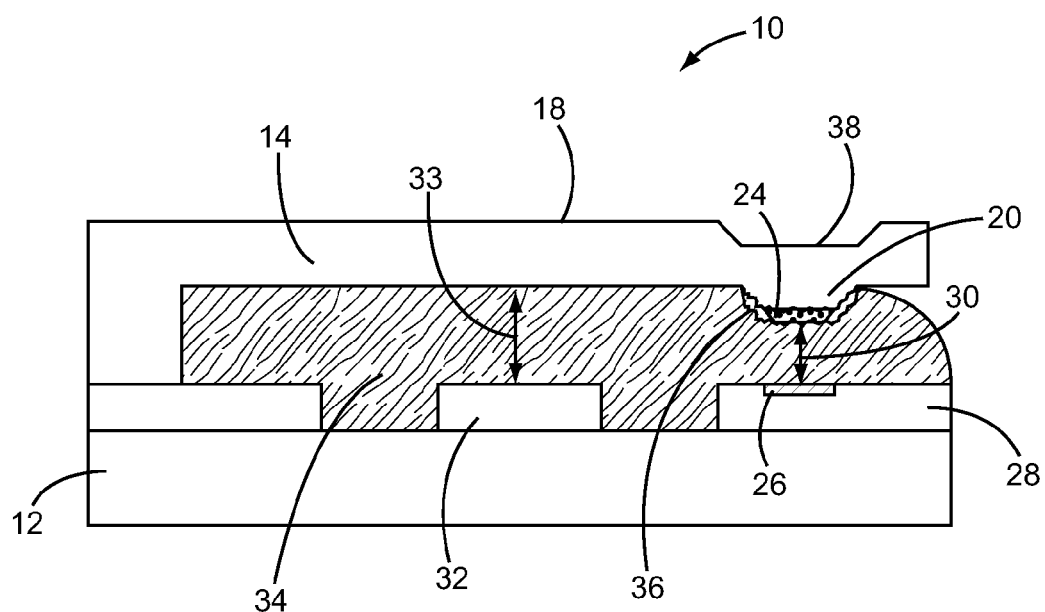
Figure 5:
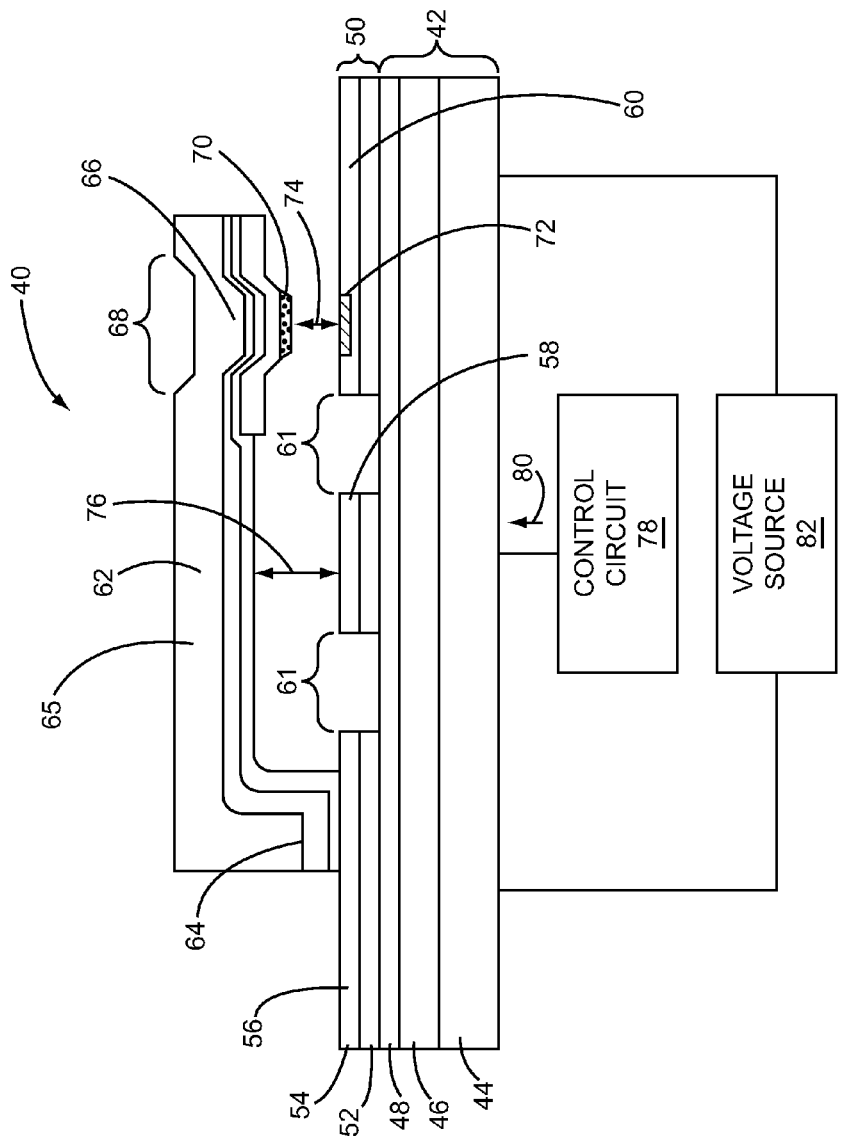
FIG. 5 is a cross sectional view of one embodiment of a MEMS switch manufactured in accordance with the present Disclosure.

The present Disclosure provides fabrication devices and methods of manufacturing MEMS switches on a substrate. FIG. 5 illustrates one embodiment of a MEMS switch 40 formed on a substrate 42 in accordance with the Disclosure. Substrate 42 may be provided as part of or be integral to a semiconductor wafer, such as a complementary metal-oxide semiconductor wafer (CMOS). In this embodiment, substrate 42 includes a semiconductor layer 44, an insulating layer 46, and a dielectric layer 48. Active semiconductor devices, such as transistors and diodes that employ PN junctions are formed in the semiconductor layer 44. The semiconductor layer 44 ranges in thickness from approximately 0.1 μm to 20 μm or more. The semiconductor wafer may include additional layers below, above, or integrated to the semiconductor layer 44 and thus the semiconductor wafer may be a few hundred μm in thickness. Although the illustrated embodiment utilizes silicon (Si) as the material of the semiconductor substrate layer 44, the semiconductor material may include gallium arsenide (GaAs), gallium nitride (GaN), indium phosphide (InP), silicon germanium (SiGe), sapphire, and like semiconductor materials.

Since the semiconductor layer 44 resides over the insulating layer 46 and the dielectric layer 48, high voltage devices, which may exceed ten (10) volts in operation, may be connected to control the operation of the MEMS switch 40 or associated circuitry. The insulating layer 46 and dielectric layer 48 are generally formed from oxides, such as Silicon Dioxide ($Si_{O2}$) and these layers 46, 48 may range in thickness from 0.1 μm to 2 μm and are formed over the semiconductor substrate layer 44. Other layers may be provided, below, above, or integrated to the insulating and dielectric layers 46, 48.

A conductive layer 50 may be formed over the substrate 42 to form the conductive portions of the MEMS switch 40. Substrate 42 and conductive layer 50 may include additional layers, such as connecting layers, passivation layers, adhesion layers, and dielectric layers, inserted among or between any of these various layers without departing from the essence of the Disclosure. In addition, conductive layer 50 may be formed as part of, be mounted on, and/or be integral to the semiconductor wafer.

In the illustrated embodiment, the MEMS switch 40 is formed on the conductive layer 50 during fabrication of the semiconductor device. As such, the present Disclosure avoids the need to fabricate MEMS switches on a different substrate from the devices that contain circuitry to be associated with the MEMS switch 40. In the alternative, the MEMS switch 40 may be mounted on the substrate 42 and connected to modules of associated circuitry.

The substrate 42 is created using a complementary metal oxide semiconductor (CMOS) fabrication process. As such, the semiconductor structure is effectively a silicon-on-insulator (SOI) configuration where the MEMS switch 40 is formed over, if not directly on, the substrate 42, which may take the form of an silicon-on-insulator (SOI) wafer. Other active semiconductor devices may be formed with or over the conductive layer 50 to form circuitry that controls or operates with the MEMS switch 40 to facilitate desired functionality.

In the illustrated example, conductive layer 50 includes an adhesion layer 52 and a conductive material 54. The conductive material 54 may be any made from any type of suitable conductive material but it is desirable that conductive material 54 be formed from a non-reactive type of conductive material which, in this example, is gold (Au). Other non-reactive type conductive materials which may be used to from the conductive layer are Rhodium (Rh), Iridium (Ir), Ruthenium dioxide ($RuO_2$), and/or an Iridium oxide ($IrO_x$), etc. To ensure that the conductive material 54 adheres to the substrate 42, the adhesive layer 52 is provided between the substrate 42 and the conductive material 54. Adhesive layer 52 may be made from any suitable material, such as titanium (Ti) or chromium (Cr). The adhesive layer 52 may be provided to ensure that the conductive material 54 adheres to the dielectric layer 48 because the dielectric layer 48 may be made from a material, such as SiN or $SiO_2$, which does not easily attach to the conductive material 54.

MEMS switch 40 may include components, such as an anchor pad 56, actuator plate 58, and contact pad 60, formed from the conductive layer 50 over the substrate 42. Gaps 61 are formed in the conductive layer 50 to define the anchor pad 56, actuator plate 58, and contact pad 60 and functionally separate these components. In this example, an actuation member 62 is formed on the conductive layer 50 which has an anchored end 64 that anchors and electrically connects the actuation member 62 to the anchor pad 56. It should be noted however that, alternatively, MEMS switch 40 may not be electrically connected to or include an anchor pad 56. For example, actuation member 62 may be physically anchored to a component, such as the anchor pad 56, but be electrically connected to another component (not shown).

Next, actuation member 62 may include an arm 65 that extends from the anchored end 64 and is suspended over the actuator plate 58. Arm 65 also may define a contact portion 66 extending from the anchored end 64. The contact portion 66 may be formed to include a recess 68 and a contact area 70 suspended over the contact pad 60 below the recess 68. When the MEMS switch 40 is open (as illustrated in FIG. 5), the distance between the contact area 70 of the actuation member 62 and the contact area 72 on the contact pad 60 defines a contact gap 74 of the MEMS switch 40. The distance between the actuation member 62 and the actuator plate 58 defines the actuator gap 76. Thus, in this case, the actuator gap 76 is defined by the distance between the arm 65 and the actuator plate 58. Recess 68 is formed on the top surface of the actuation member 62 so that the contact area 70 on the actuation member 62 is positioned below the portion of the arm 65 formed over the actuator plate 58. This helps ensure that the contact gap 74 is smaller than the actuator gap 76 which prevents shorts between the actuator plate 58 and the anchor pad 56 when the MEMS switch 40 is closed (not shown).

To actuate the arm 65 and close the MEMS switch 40, the contact area 70 on the actuation member 62 is moved toward contact area 72 on the contact pad 60 so that contact area 70 and contact area 72 are electrically coupled to one another. In the illustrated embodiment, closing the MEMS switch 40 creates an electrical path through the actuation member 62 from the anchor pad 56 to the contact pad 60. To actuate the actuation member 62, a control circuit 78 is provided which sends a control signal 80 to the actuator plate 58 and creates an electromagnetic field. The electromagnetic field moves the arm 65 toward the actuator plate 58 thereby moving the actuation member 62 from the open position to the closed position. A voltage source 82 may be connected between the anchor pad 56 and the contact pad 60 so that a voltage signal may be provided or received from circuitry (not shown) coupled to the anchor pad 56 and contact pad 60.

Figure 6:
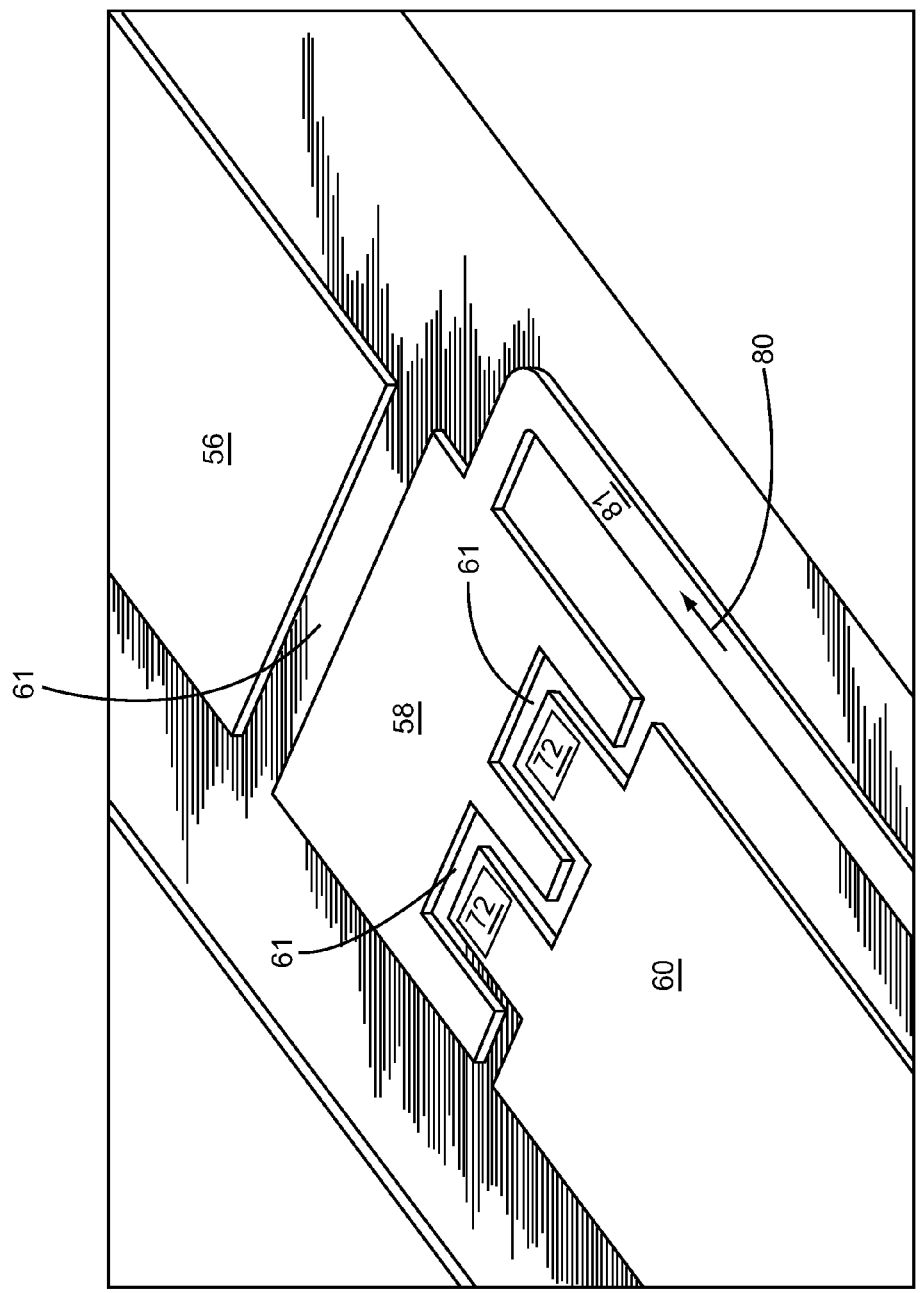
FIG. 6 is a perspective view of the embodiment of the MEMS switch illustrated in FIG. 5 without an actuation member.

With reference to FIG. 6, a perspective view of a portion of a MEMS switch 40 is provided to more clearly illustrate an exemplary configuration of the MEMS switch 40. The actuation member 62 is not illustrated in order to better depict the anchor pad 56, the contact pad 60, the actuator plate 58, gaps 61 and the contact areas 72 of the contact pad 60. Also illustrated is an actuator control path 81 which provides the control signal 80 to the actuator plate 58.

Figure 7:
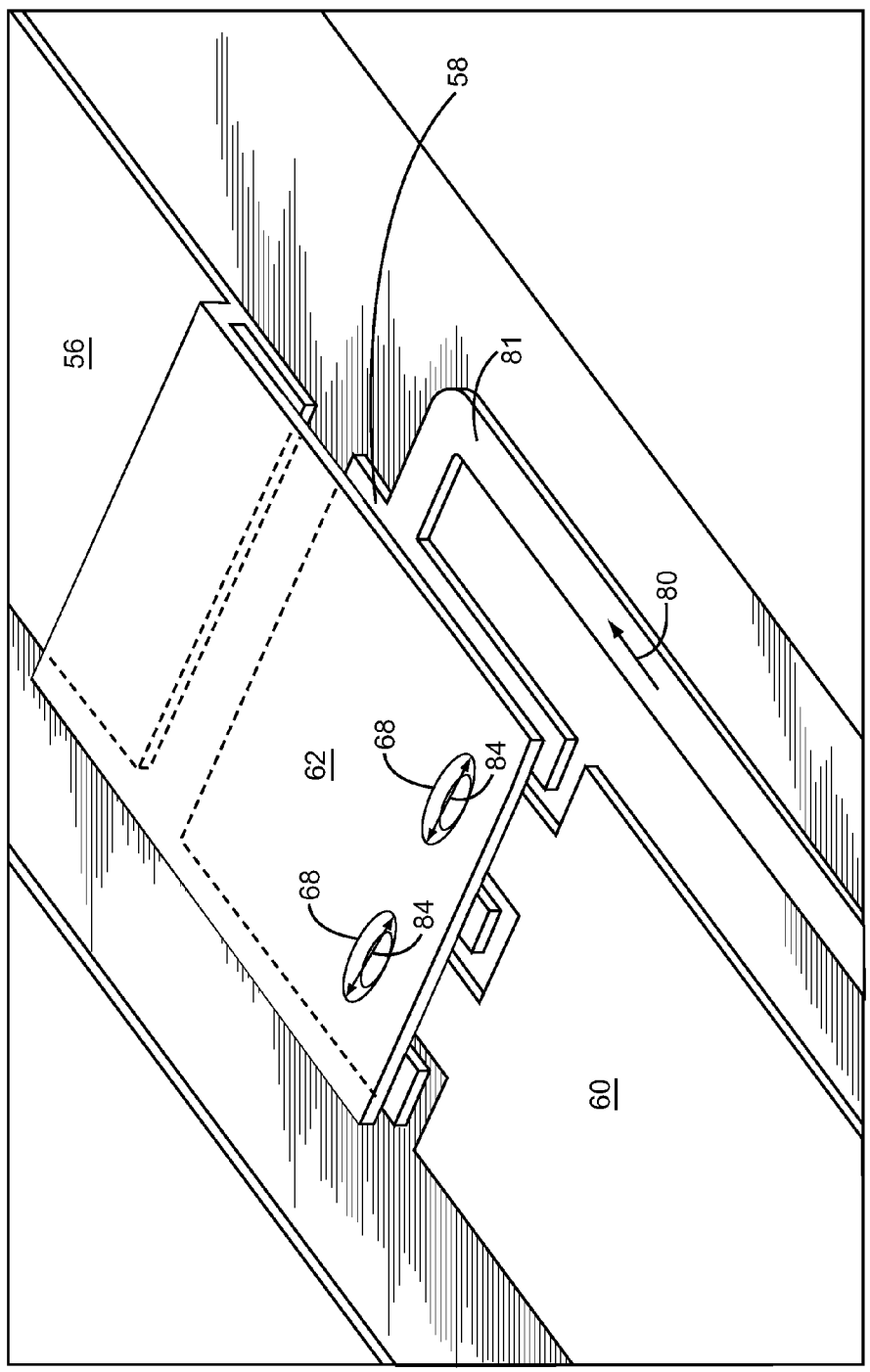
FIG. 7 is a perspective view of the embodiment of the MEMS switch illustrated in FIG. 5 with the actuation member.

Referring now to FIG. 7, the MEMS switch 40 of FIG. 6 is illustrated with the actuation member 62. Notably, the actuation member 62 is affixed to the anchor pad 56 and extends over the actuator plate 58 as well as the contact areas 72 of the contact pad 60. When the MEMS switch 40 is not actuated, the actuation member 62 remains suspended over the contact areas 72 (shown in FIG. 6) of the contact pad 60. Recesses 68 are shown on the top surface of the actuation member 62. Recesses 68 may be formed in any shape but in this example the recesses 68 are formed to have an approximately circular periphery. A diameter 84 of these recesses 68 may thus determine the size of the contact area 70 (illustrated in FIG. 5) on the actuation member 62.

The table below provides measured contact resistances for the MEMS switch 40 between the anchor pad 56 and the contact pad 60 when the contact gap 74 is approximately 5000 Angstroms (A), and the actuator gap 76 is approximately 1 µm.

| Recess Diameter | Voltage at Actuator Plate | (4-Wire) Resistance |
|---|---|---|
| 3 µm | 70 V | 0.305 Ω |
| 3 µm | 73 V | 0.300 Ω |
| 3 µm | 80 V | 0.244 Ω |
| 3 µm | 90 V | 0.220 Ω |
| 3 µm | 90 V | 0.208 Ω |
| 5 µm | 70 V | 0.300 Ω |
| 5 µm | 71 V | 0.350 Ω |
| 5 µm | 80 V | 0.240 Ω |
| 5 µm | 90 V | 0.260 Ω |
| 5 µm | 90 V | 0.226 Ω |
| 7 µm | 70 V | 0.270 Ω |
| 7 µm | 76 V | 0.310 Ω |
| 7 µm | 80 V | 0.245 Ω |
| 7 µm | 90 V | 0.217 Ω |
| 7 µm | 90 V | 0.202 Ω |

Figure 8A:
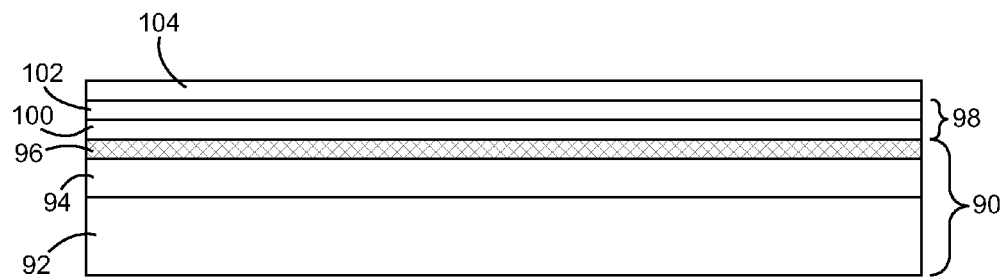
FIGS. 8A-8E illustrates steps in one embodiment of a method for manufacturing a first embodiment of a MEMS fabrication device in accordance with the Disclosure.

As shall be explained in further detail below, MEMS switches may be manufactured in accordance with the Disclosure by providing MEMS fabrication devices having dual sacrificial layers which mold the actuation member. FIGS. 8A-8E illustrates steps for manufacturing one embodiment of a MEMS fabrication device in accordance with the Disclosure. FIG. 8A shows a substrate 90 that includes a semiconductor layer 92, an insulating layer 94, and a dielectric layer 96. A conductive layer 98 is placed over the substrate 90 and includes an adhesive layer 100 and a conductive material 102. In this example, the conductive layer 98 is placed directly on the substrate 90 and the adhesive layer 100 attaches the conductive material 102 to the dielectric layer 96 of the substrate 90. A first sacrificial layer 104 is also formed over the conductive material 102. Thus, in this example, the first sacrificial layer 104 is provided over the conductive layer 98 prior to forming the components for a MEMS device.

Figure 8B:
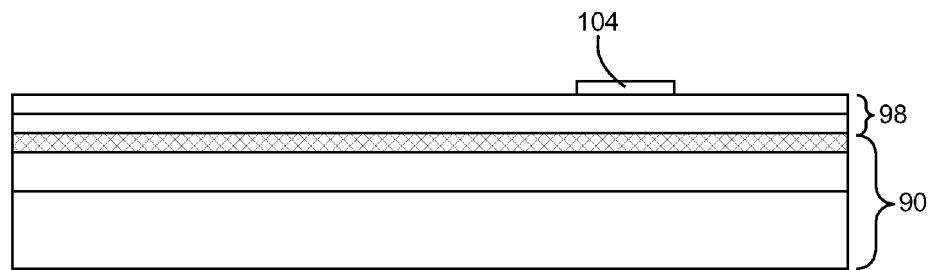
Figure 8C:
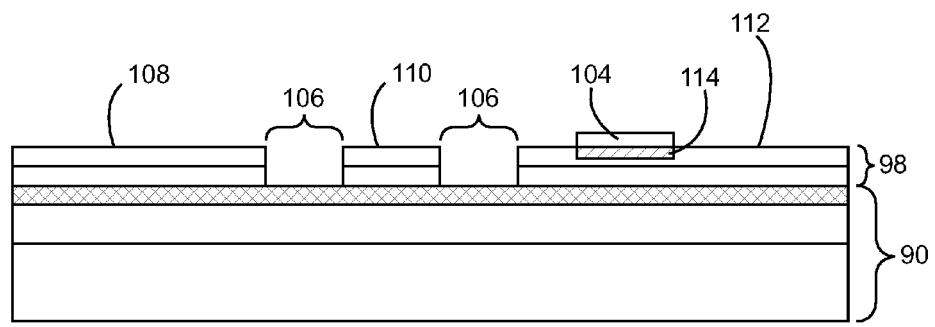

In FIG. 8B, the first sacrificial layer 104 is patterned over the conductive layer 98. As shown in FIG. 8C, gaps 106 may then be patterned into the conductive layer 98 to form the anchor pad 108, actuator plate 110, and contact pad 112 over the substrate 90. The steps in FIGS. 8B and 8C may be done simultaneously or separately utilizing for example an etch back or lift-off metal process. First sacrificial layer 104 may be provided on the conductive layer 98 to cover at least a contact area 114 of the contact pad 112. This contact area 114 is the area of the contact pad 112 that will contact an actuation member and close a MEMS switch formed from on the fabrication device. In the illustrated embodiment, the first sacrificial layer 104 is shaped so that it does not extend beyond and is formed only over the contact pad 112.

Figure 8D:
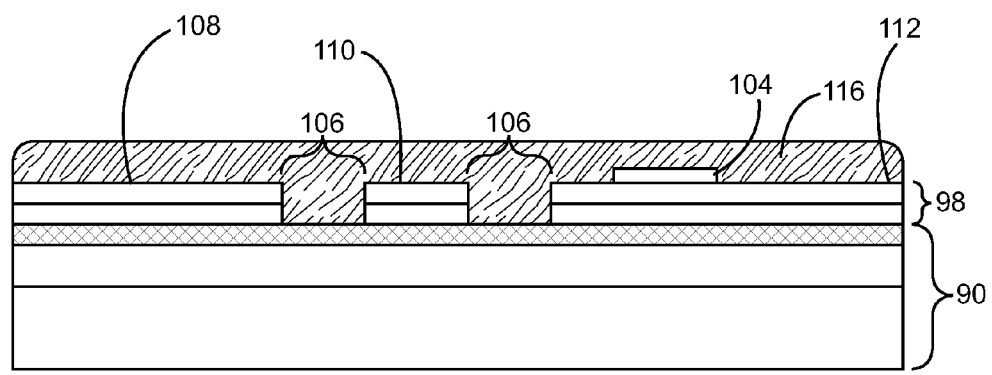
Figure 8E:
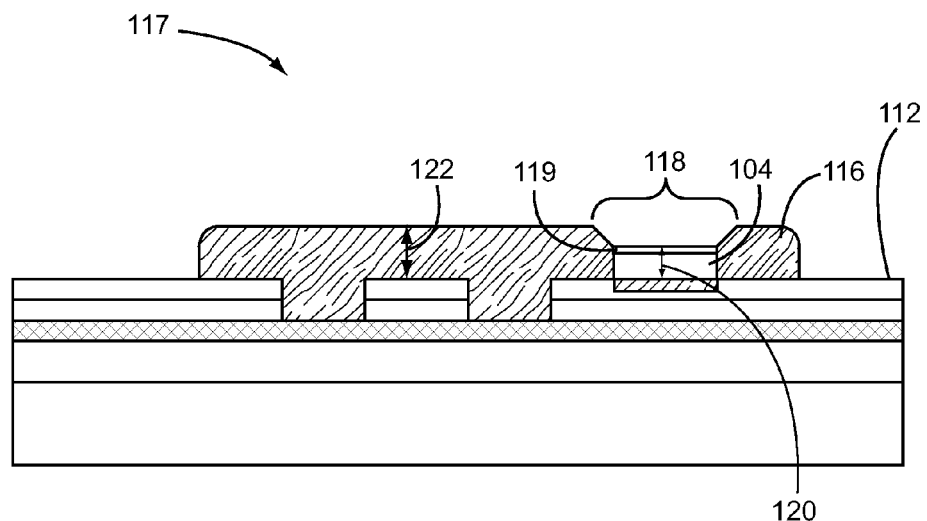

Referring now to FIG. 8D, a second sacrificial layer 116 may then be coated on the conductive layer 98 over the anchor pad 108, actuator plate 110, contact pad 112, first sacrificial layer 104, and within the gaps 106. Next, as shown in FIG. 8E, the second sacrificial layer 116 may then be patterned using reactive ion etching or wet developing to create a first embodiment of the MEMS fabrication device 117. Patterning of the second sacrificial layer 116 in the MEMS fabrication device 117 creates a recess 118 in the second sacrificial layer 116 that exposes an area 119 of the first sacrificial layer 104 that forms part of the recess 118. The area 119 may include the entire first sacrificial layer 104 or as illustrated in FIG. 8E, only part of the first sacrificial layer 104. Forming the recess 118 by utilizing first and second sacrificial layers 104, 116 allows recess 118 to be manufactured consistently. Since the exposed area 119 of the first sacrificial layer 104 forms part of the recess 118 the accuracy required to consistently pattern the shape and depth of recess 118 in the second sacrificial layer 116 is reduced.

First and second sacrificial layers 104, 116 may be made from any type of suitable sacrificial material(s). To more consistently pattern the shape and depth of recess 118, the sacrificial materials of the first and second sacrificial layers 104, 116 need only be selected so that whatever technique is utilized to pattern the recess 118 into the second sacrificial layer 116 either does not remove a significant amount of material from the first sacrificial layer 104 or consistently removes material from the first sacrificial layer 104. Thus, what sacrificial materials should be utilized in first and second sacrificial layers 104, 116 may depend on the tolerance requirements for variations in the shape and depth of the recess 118. In the illustrated embodiment, the first sacrificial layer 104 is a metal sacrificial layer made from a material such as titanium-tungsten, titanium-chromium, or copper (Cu). The second sacrificial layer 116 may be a polymer based sacrificial layer made from a material such as a polymer polymethylglutarimide (PMGI). As shall be explained in further detail below, when an actuation member for a MEMS switch is formed over the sacrificial layers 104, 116 of the MEMS fabrication device 117, the first and second sacrificial layers 104, 116 may define or at least partially define a contact gap 120 and an actuator gap 122 of the MEMS switch. It should be noted that sacrificial layers in addition to or integrated with the first and second sacrificial 104, 116 may be provided to form the mold of actuation member.

Figure 9A:
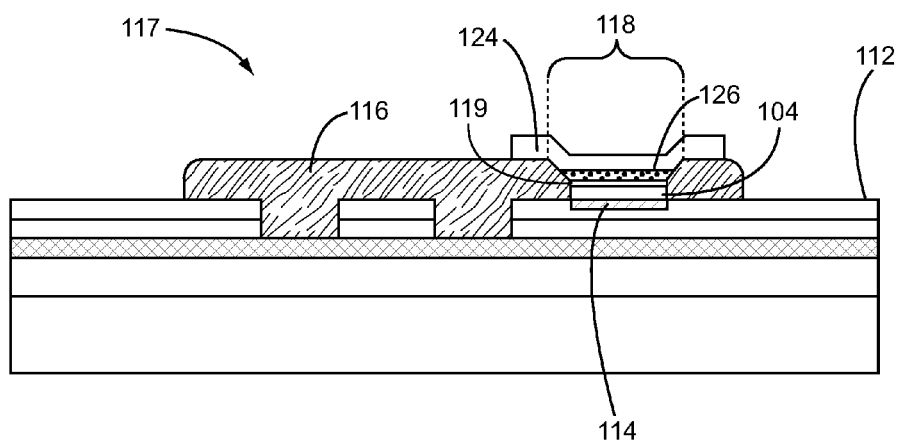
FIGS. 9A-9H illustrate steps in one embodiment of a method for manufacturing an embodiment of a MEMS switch utilizing the first embodiment of the MEMS fabrication device.

Once the first embodiment of the MEMS fabrication device 117 is provided, FIGS. 9A-9H demonstrate steps for manufacturing one embodiment of a MEMS switch using the MEMS fabrication device 117. In this embodiment, a hard conductive layer 124 is provided within the recess 118 to form the contact area 126 of an actuation member, as illustrated in FIG. 9A. This contact area 126 is thus formed on the area 119 of the first sacrificial layer exposed by the recess 118. Since the first sacrificial layer 104 is a metal sacrificial layer, the first sacrificial layer 104 covers and protects the contact area 126 from contamination by the polymer based second sacrificial layer 116 thus providing for a cleaner contact area 126 when the MEMS switch is formed. Also, the first sacrificial layer 104 may have a high degree of planarization and thus provide for the formation of a more planar contact area 126 within the recess 118. Hard conductive layer 124 may be made from one or more hard conductive material such as Rhodium (Rh), Iridium (Ir), Ruthenium dioxide (RuO$_2$), an Iridium oxide (IrO$_x$), or the like. This hard conductive layer 124 allows for more force to be placed on the contact area 126 and makes the MEMS switch more robust.

Figure 9B:
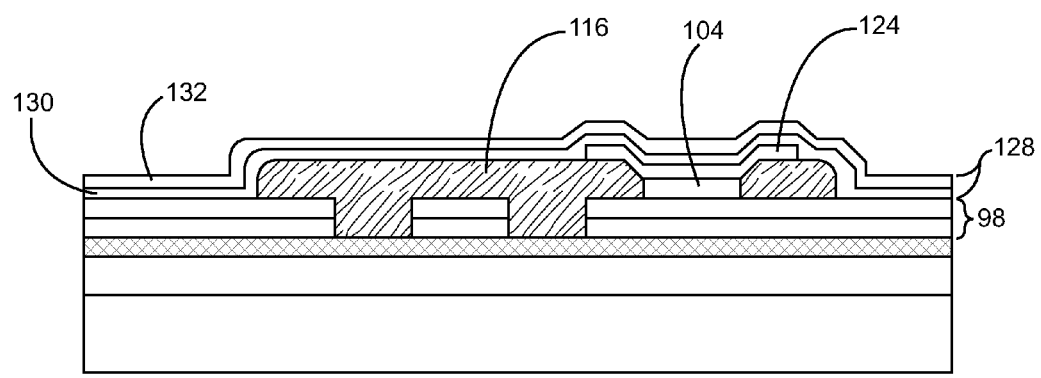

Referring now to FIG. 9B, a seed layer 128 is placed over the conductive layer 98 and the first and second sacrificial layers 104, 116 utilizing a sputtering or evaporation process. Seed layer 128 may include an attachment layer 130 and a seed film 132 over the attachment layer 130. Attachment layer 130 attaches the seed film 132 onto the conductive layer 98, the second sacrificial layer 116, and the hard conductive layer 124 formed over the exposed area 119 of the first sacrificial layer 104. Seed film 132 may be made from a conductive material such as gold (Au) and attachment layer 130 may be made from an adhesive material such as titanium (Ti) or chromium (Cr).

Figure 9C:
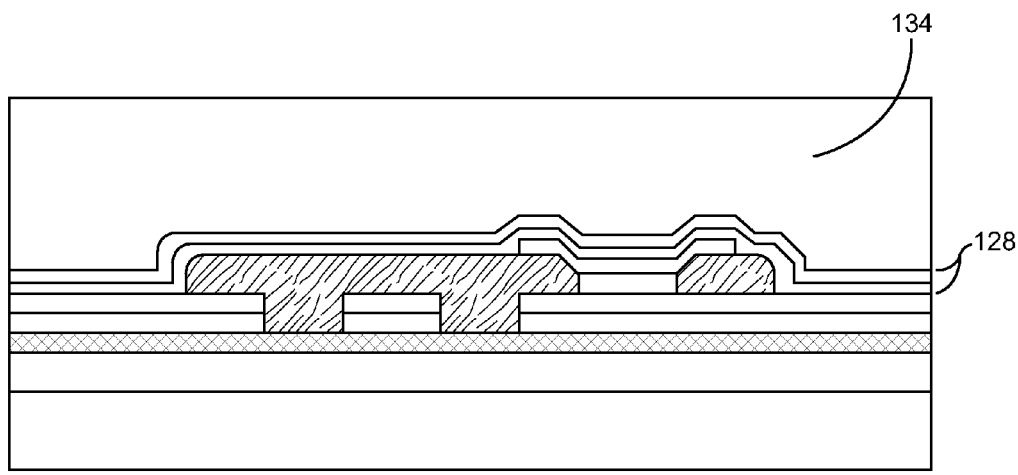
Figure 9D:
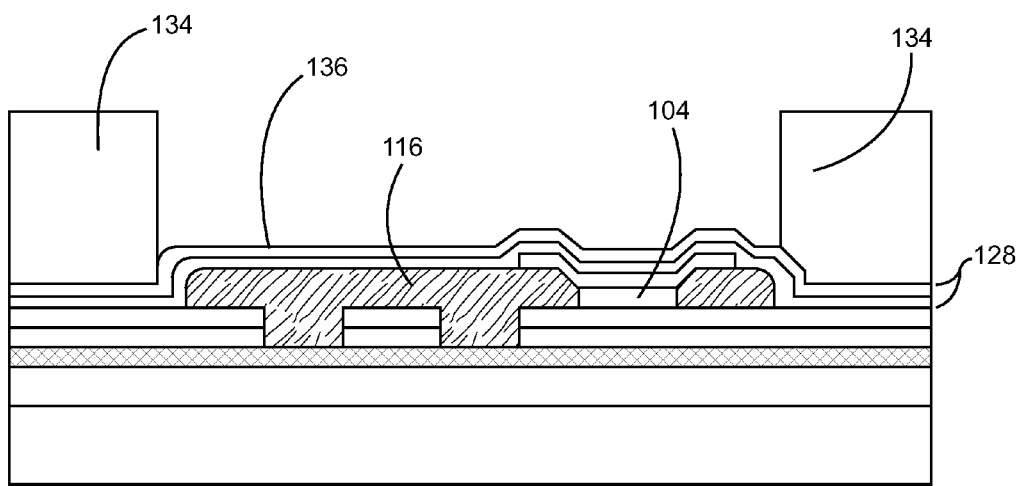
Figure 9E:
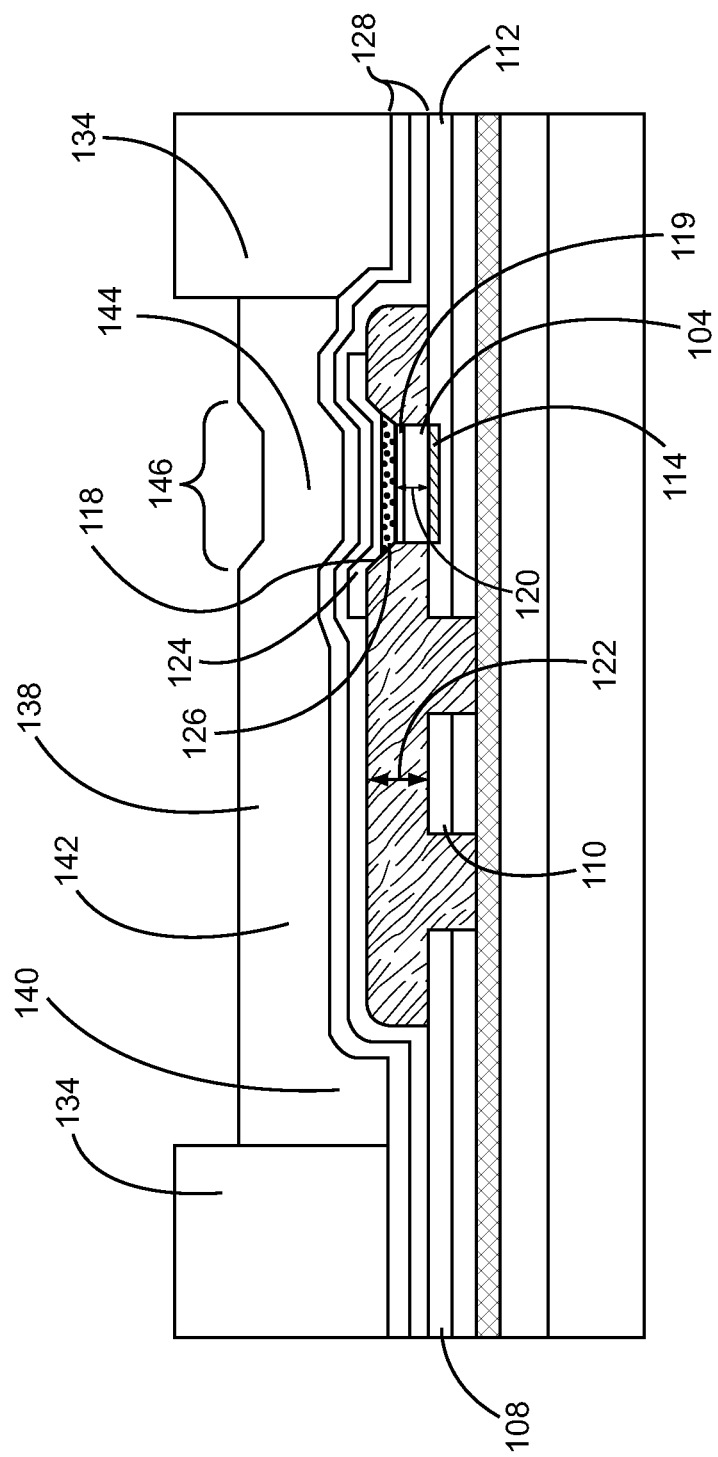

Next, as shown in FIGS. 9C-9D, a photoresist mask 134 is provided on the seed layer 128 and pattered over the first and second sacrificial layers 104, 116 to provide for an electroplating area 136. A conductive material, such as gold (Au), is then electroplated onto the seed layer 128. As illustrated in FIG. 9E, electroplating of seed layer 128 forms actuation member 138. Actuation member 138 may include an anchored end 140 attached to the anchor pad 108, an arm 142, and a contact portion 144. Seed layer 128 also attaches the hard conductive layer 124 to the actuation member 138 and defines the contact area 126 of the actuation member 138. Recess 118 causes contact portion 144 to have recess 146 on its top surface.

The first and second sacrificial layers 104, 116 thus provide a mold for the formation of the actuation member 138. The arm 142 of the actuation member 138 may be provided over the actuator plate 110 to define the actuator gap 122. Also, the contact portion 144 of the actuation member 138 is formed within the recess 118 and the first sacrificial layer 104 is positioned in the contact gap 120 between the contact area 126 of the actuation member 138 and the contact area 114 of the contact pad 112. Forming contact portion 144 within the recess 118 molds the contact area 126 over the exposed area 119 of the first sacrificial layer 104. Contact portion 144 thus may define a recess 146 on its top surface and the contact area 126 may be positioned to be lower than the arm 142. Accordingly, in the illustrated embodiment, the contact gap 120 may be smaller than the actuator gap 122. Since the depth and shape of recess 118 can be formed consistently, there are less variations in the size of the contact gap 120 in the manufactured MEMS switch.

Figure 9F:
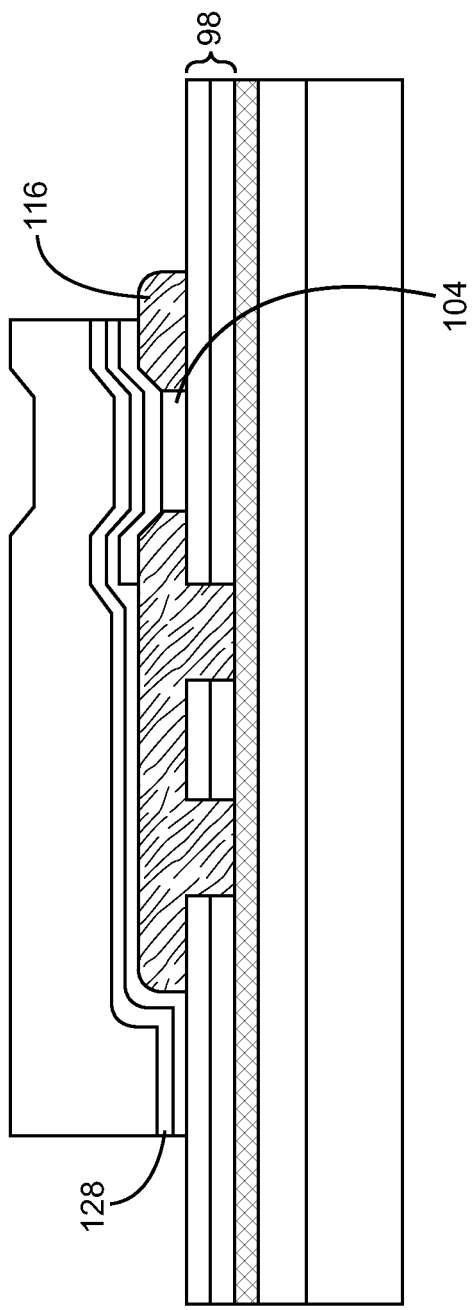
Figure 9G:
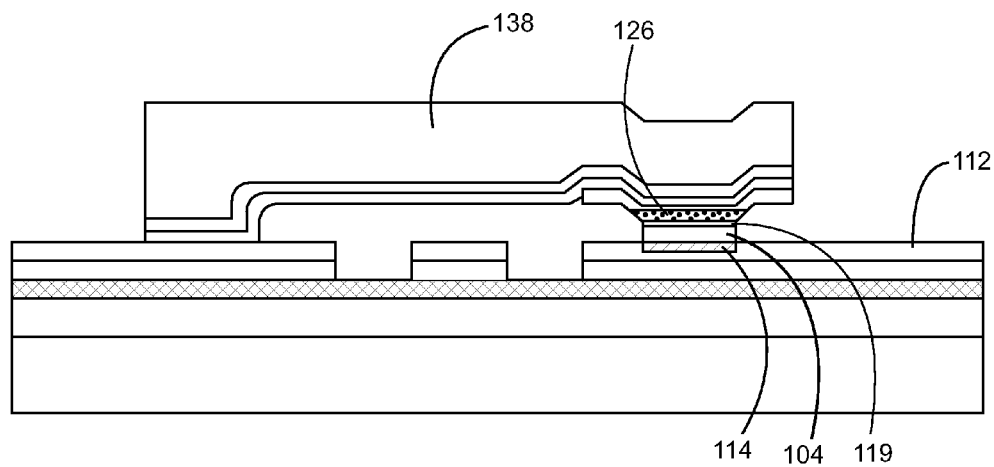
Figure 9H:
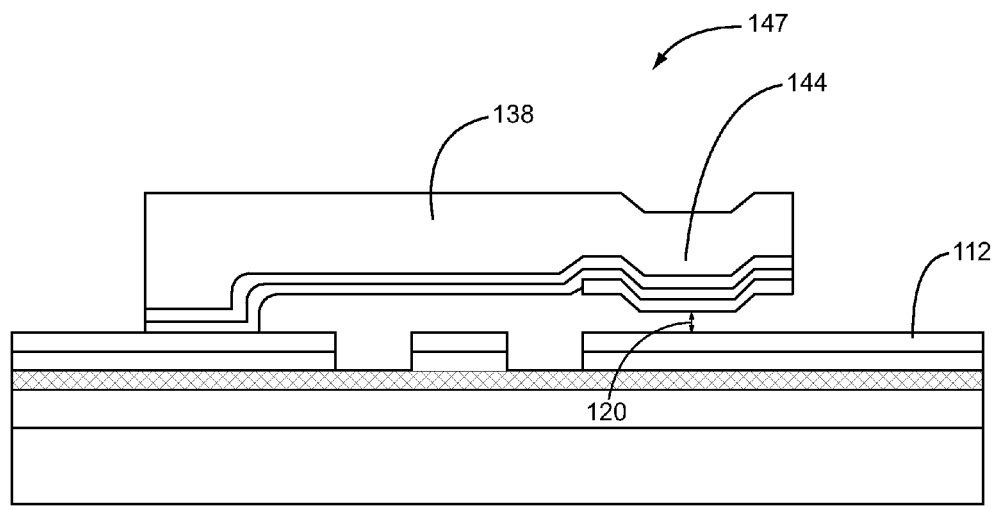

In FIG. 9F, the photoresist mask 134 is removed along with portions of the seed layer 128 over the conductive layer 98 utilizing a buffered oxide etch. Sacrificial layers 104, 116 may then be exposed simultaneously utilizing the same mask (not shown) and removed as illustrated in FIGS. 9G-9H to form a first embodiment of a MEMS switch 147. It should be noted that first and second sacrificial layers 104, 116 may also be removed simultaneously using a tetramethylammonium hydroxide (TMAH) developer. However, FIG. 9G depicts the second sacrificial layer 116 being removed first. As explained above, the second sacrificial layer 116 of this embodiment may be formed from a polymer based material, such as a polymer polymethylglutarimide (PMGI), and the first sacrificial layer 104 may be a metal sacrificial layer such as titanium-tungsten, titanium-chromium, or copper (Cu). Thus, an N-Methyl-2-pyrrolidone (NMP) developer can be utilized to remove the second sacrificial layer 116 while maintaining the first sacrificial layer 104 intact.

FIG. 9G illustrates the first sacrificial layer 104 between the contact area 126 of the actuation member 138 and the contact area 114 on the contact pad 112. Accordingly, the exposed area 119 of the first sacrificial layer 104 may protect the contact area 126 of the actuation member 138 from the second sacrificial layer 116 (illustrated in FIG. 9F). Similarly, the first sacrificial layer 104 may protect the contact area 114 on the contact pad 112 from the second sacrificial layer 116. Consequently, first sacrificial layer 104 protects contact areas 114, 126 from carbon based contamination which reduces the resistance of the MEMS switch 147 and increases performance. In FIG. 9K, the first sacrificial layer 104 is removed to create the MEMS switch 147. The contact portion 144 of the actuation member 138 in MEMS switch 147 is suspended over the contact pad 112 to form the contact gap 120. The first sacrificial layer 104 may be removed using a diluted hydrogen peroxide solution ($H_2O_2$).

Figure 10A:
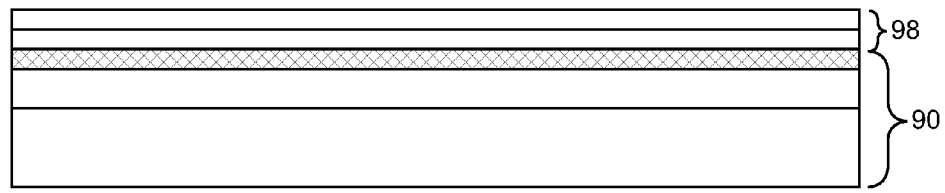
FIGS. 10A-10E illustrate steps in a second embodiment of a method for manufacturing the first embodiment of the MEMS fabrication device.
Figure 10B:
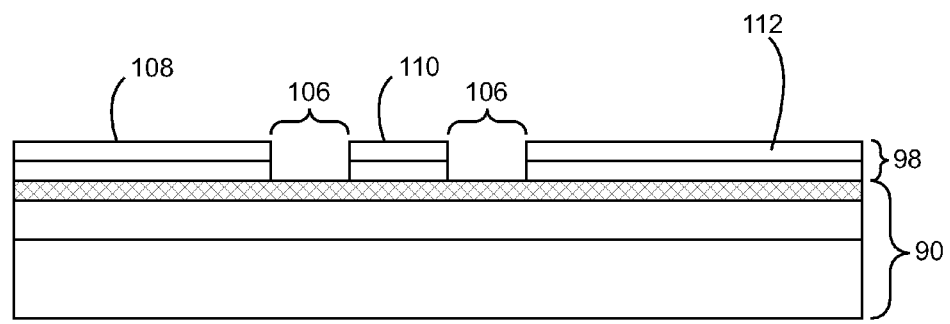
Figure 10C:
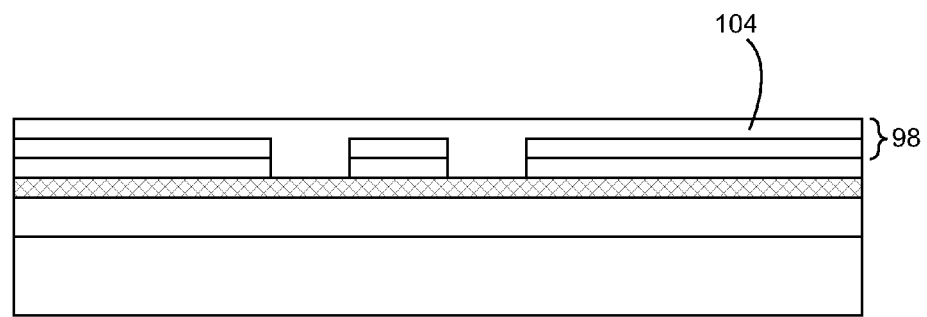
Figure 10D:
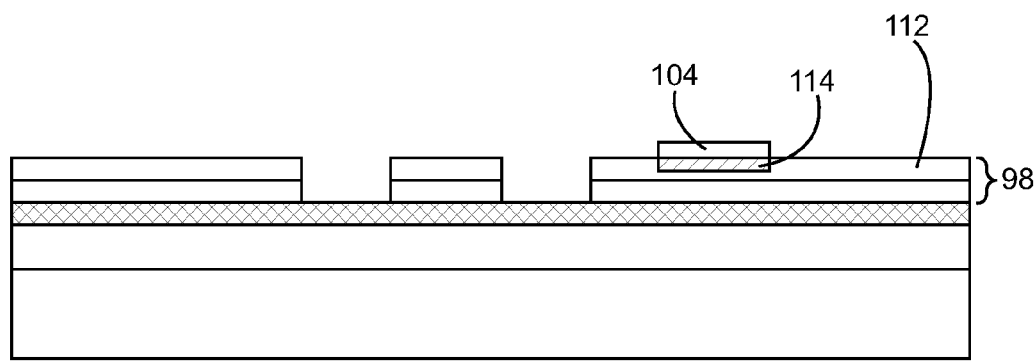
Figure 10E:
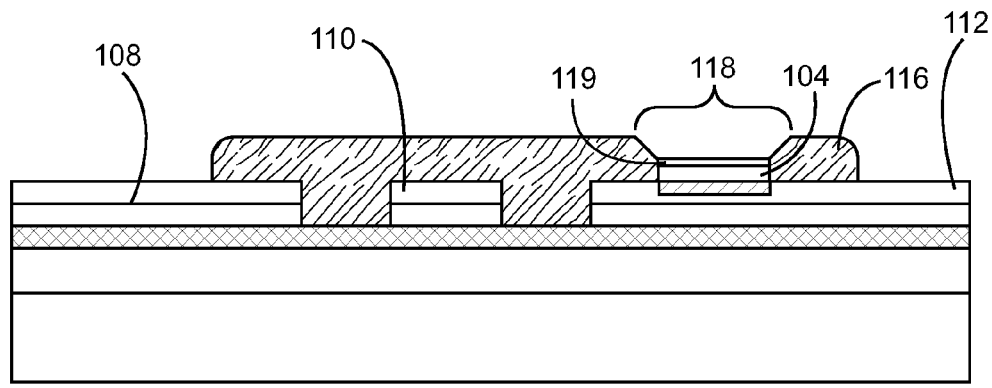

FIGS. 10A-10E illustrate another series of steps for creating the first embodiment of the MEMS fabrication device 117. As shown in FIGS. 10A-10B, the conductive layer 98 on the substrate 90 is patterned to form the gaps 106 that expose the substrate 90 and form the anchor pad 108, actuator plate 110, and contact pad 112 over the substrate 90. Subsequently, as shown in FIGS. 10C-10D, the first sacrificial layer 104 is placed over the conductive layer 98 and patterned to cover the contact area 114 on the contact pad 112. As shown in FIG. 10E, the second sacrificial layer 116 may then be placed over the anchor pad 108, actuator plate 110, contact pad 112, and the first sacrificial layer 104 and patterned to define the recess 118 which exposes the area 119 of the first sacrificial layer 104.

Figure 11A:
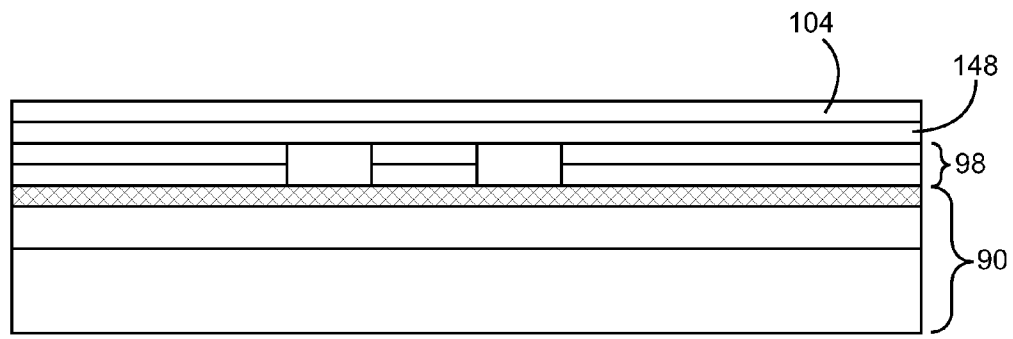
FIGS. 11A-11C illustrate steps in one embodiment of a method for manufacturing a second embodiment of the MEMS fabrication device in accordance with the Disclosure.
Figure 11B:
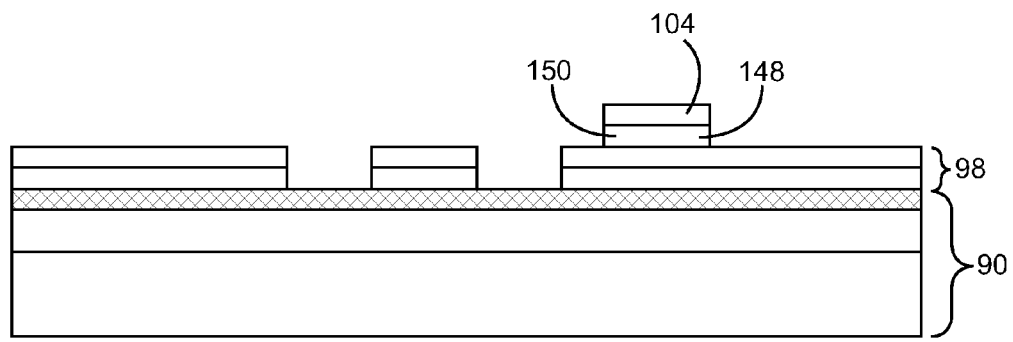
Figure 11C:
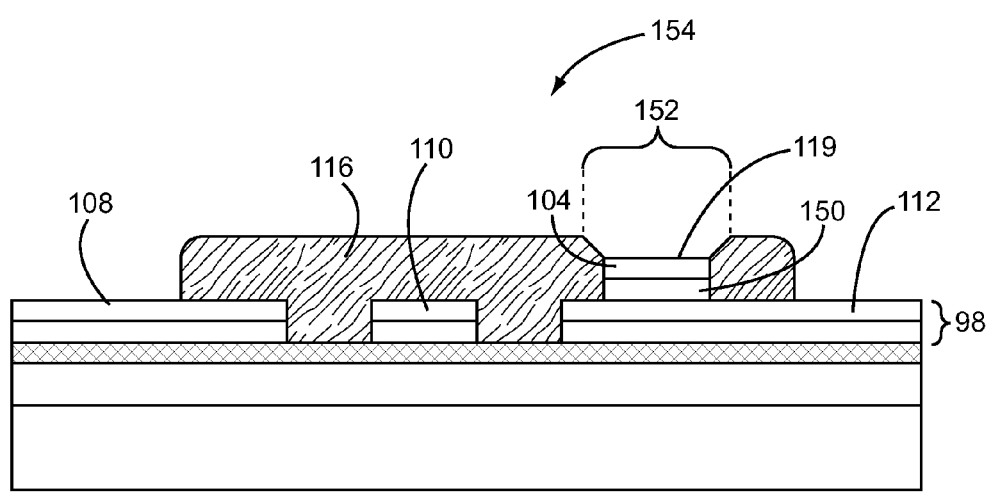

FIGS. 11A-11C illustrate a series of steps for creating a second embodiment of a MEMS fabrication device. As shown in FIG. 11A, conductive layer 98 is formed in accordance with the steps described above in FIGS. 10A-10B. However, in this example, a hard conductive layer 148 is also placed over the conductive layer 98. Hard conductive layer 148 is positioned between the first sacrificial layer 104 and the conductive layer 98. As shown in FIG. 11B, the metal sacrificial layer 104 and the hard conductive layer 148 may then be patterned utilizing the same photo resist mask (not shown), to form a bump pad 150. Next, as illustrated in FIG. 11C, the second sacrificial layer 116 may then be placed and patterned over the anchor pad 108, actuator plate 110, the contact pad 112, the first sacrificial layer 104, and the bump pad 150. As in the previous embodiment, the second sacrificial layer 116 includes a recess 152 that exposes the area 119 of the first sacrificial layer 104. Thus, the second embodiment of the MEMS fabrication device 154 has the bump pad 150.

Figure 12A:
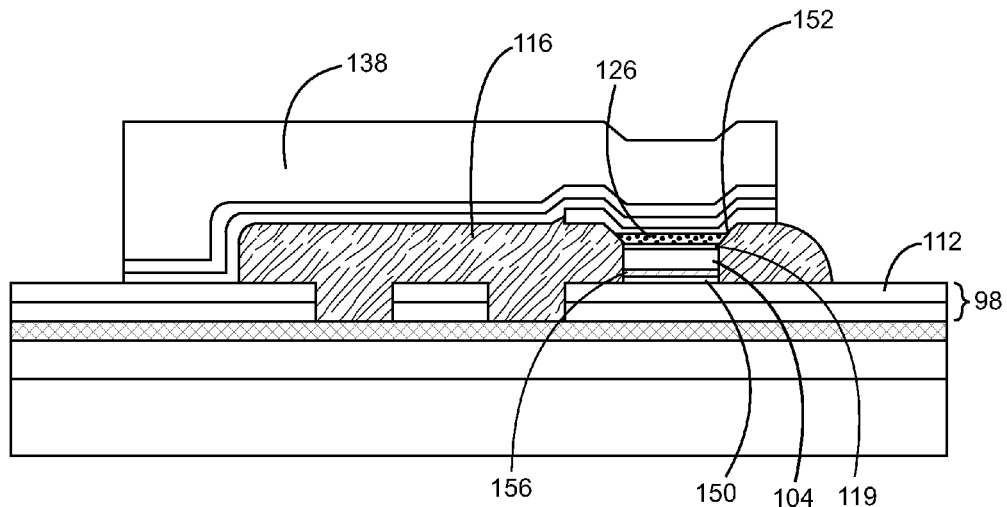
FIGS. 12A-12B illustrate steps in one embodiment of a method for manufacturing another embodiment of a MEMS switch utilizing the second embodiment of the MEMS fabrication device.
Figure 12B:
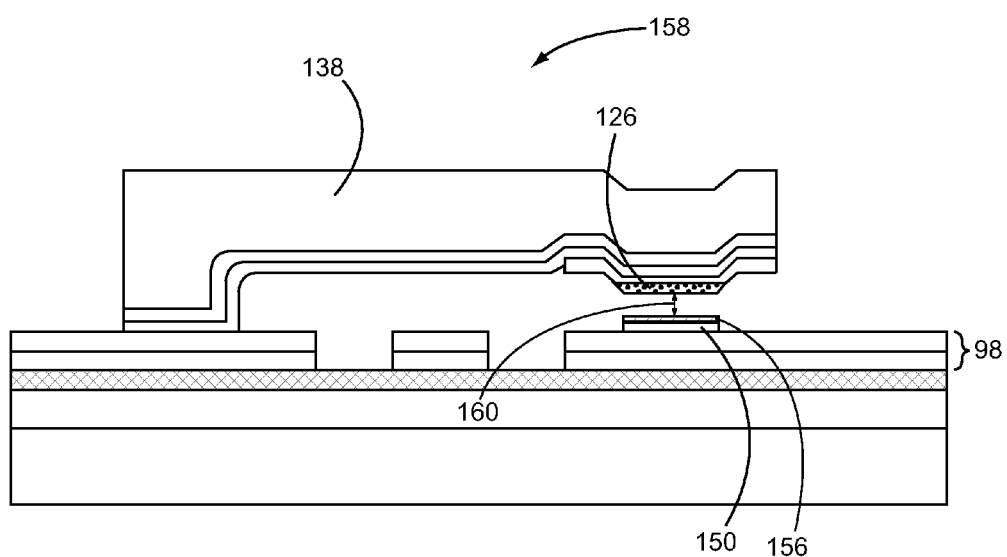

Next, FIGS. 12A-12B illustrate steps for creating another embodiment of a MEMS switch from the MEMS fabrication device 154. FIG. 12A illustrates the MEMS fabrication device 154 after the actuation member 138 is formed on the first and second sacrificial layers 104, 116 utilizing the steps similar to those described above for FIGS. 9A-9F. The contact area 126 of the actuation member 138 is formed over the exposed area 119 of the first sacrificial layer 104 in recess 152. In this embodiment, the contact area 156 of the contact pad 112 is on the bump pad 150 and first sacrificial layer 104 is positioned between the hard conductive layer 124 and the bump pad 150.

As illustrated in FIG. 12B, first and second sacrificial layers 104, 116 may be removed utilizing steps similar to those described above in FIGS. 9G-9H to form the MEMS switch 158. In MEMS switch 158, the contact area 126 on hard conductive layer 124 of the actuation member 138 is suspended over the contact area 156 on the bump pad 150 to define a contact gap 160. Thus, both contact areas 126, 156 of MEMS switch 158 are made of a hard conductive material and the distance between contact area 126 on the actuation member 138 and the contact area 156 on the bump pad 150 define an actuation gap 160.

Figure 13A:
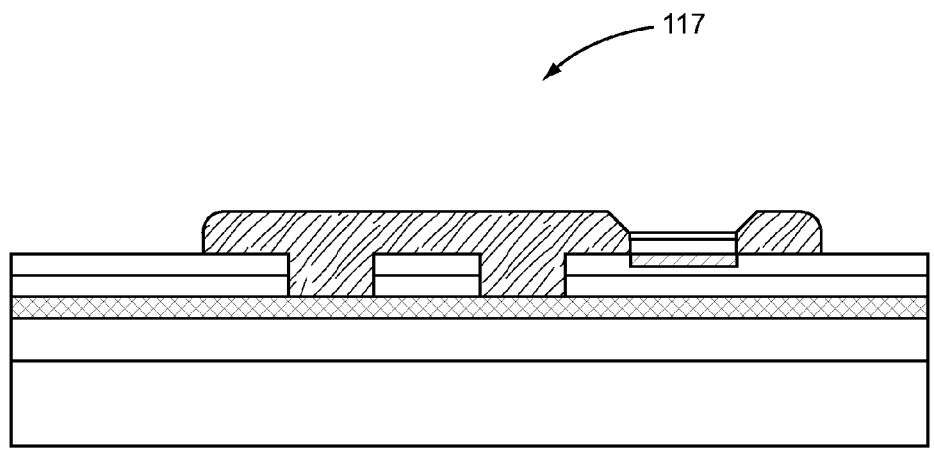
FIGS. 13A-13F illustrate steps in one embodiment of a method for manufacturing yet another embodiment of a MEMS switch utilizing the first embodiment of the MEMS fabrication device.
Figure 13B:
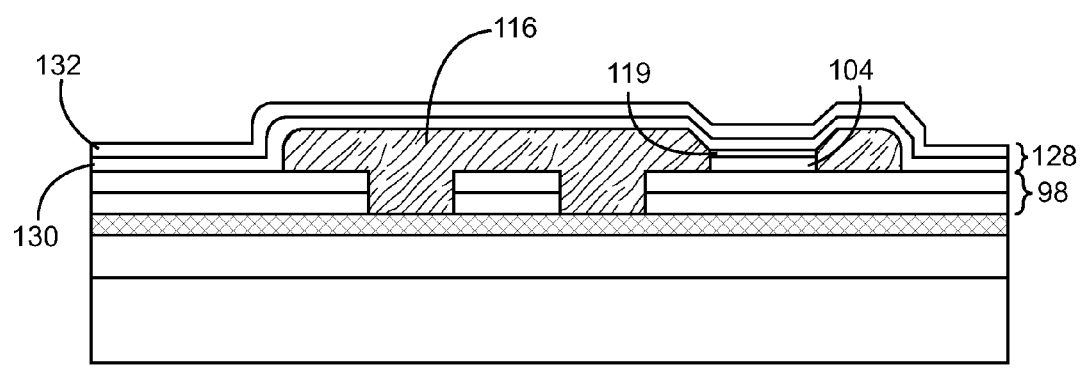
Figure 13C:
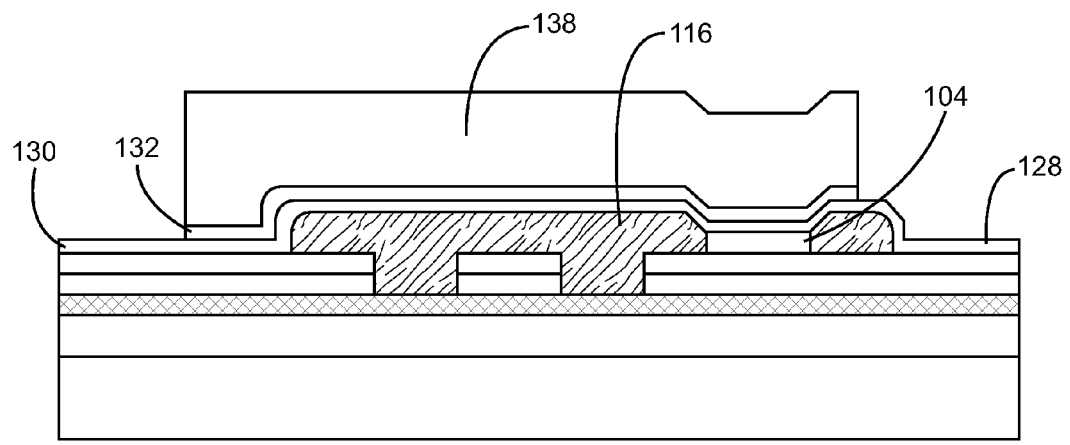
Figure 13D:
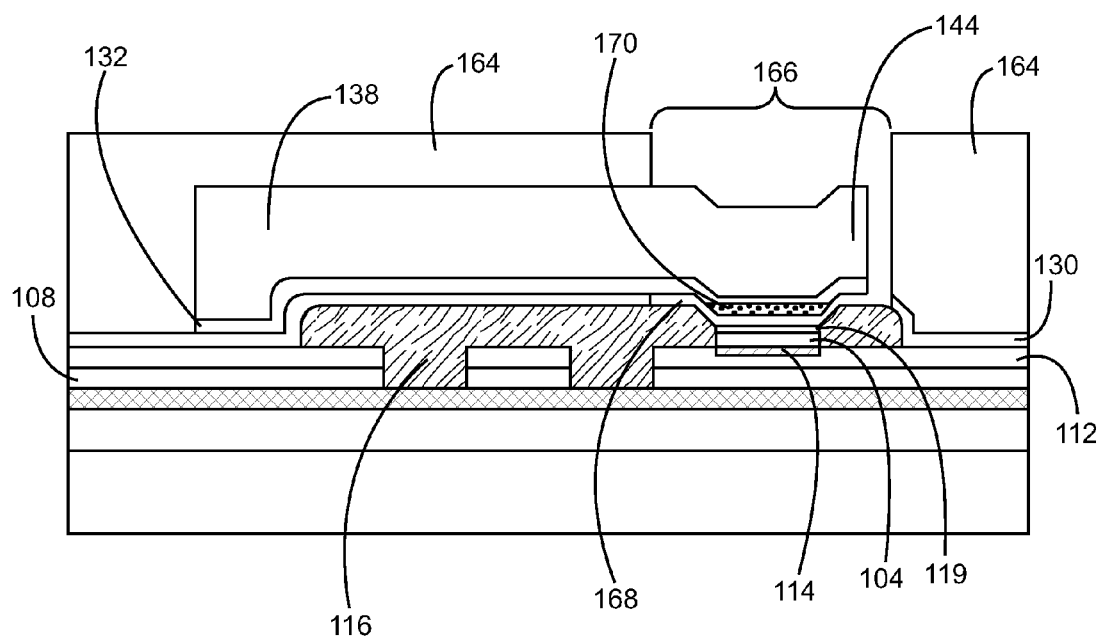
Figure 13E:
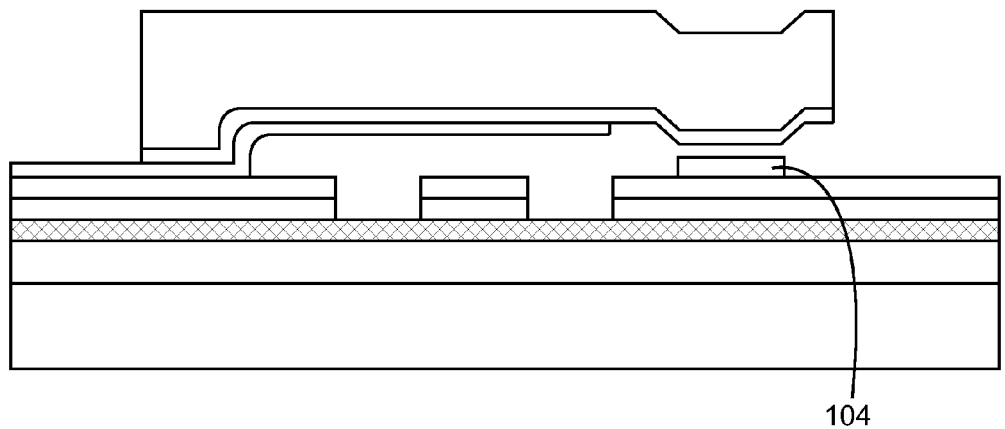
Figure 13F:
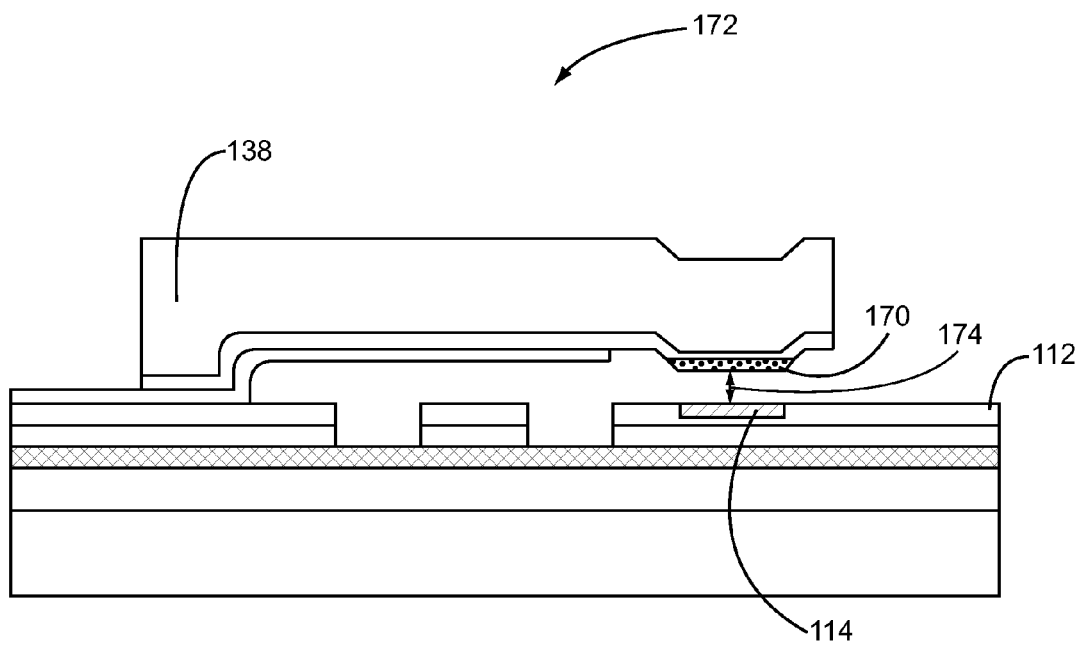

FIGS. 13A-13F illustrate steps for manufacturing another embodiment of a MEMS switch from MEMS fabrication device 117. FIG. 13A illustrates the MEMS fabrication device 117 constructed in accordance with the steps described in FIGS. 8A-8E. Next, FIG. 13A shows the seed layer 128 provided over the conductive layer 98, the second sacrificial layer 116 and the exposed area 119 of the first sacrificial layer 104. As mentioned above, the seed layer 128 may include the attachment layer 130 and the seed film 132. In FIG. 13C, the actuation member 138 is electroplated over the first and second sacrificial layers 104, 116, utilizing steps similar to those described above in FIGS. 9C-9F. In this case however, the portions of the seed film 132 that extend beyond the actuation member 138 are removed while the attachment layer 130 remains. As shown in FIG. 13D, a photoresist mask 164 is then placed over the anchor pad 108, actuation member 138, and contact pad 112. This photoresist mask 164 is patterned to define a mask opening 166 around the contact portion 144 of the actuation member 138. Photoresist mask 164 may be attached to the attachment layer 130 on the anchor pad 108 and contact pad 112. The portion 168 of the attachment layer 130 underneath and near the contact portion of the actuation member 138 and over the exposed area 119 of the first sacrificial layer 104 is removed utilizing the mask opening 166. Consequently, in this embodiment, the contact area 170 of the actuation member 138 is on the seed film 132 which is now part of the actuation member 138. Subsequently, first and second sacrificial layers 104, 116 are removed, as shown in FIGS. 13E-13F, to create MEMS switch 172. The contact area 170 on the actuation member 138 and the contact area 114 on the contact pad 112 define the actuation gap 174 in MEMS switch 172.

Figure 14A:
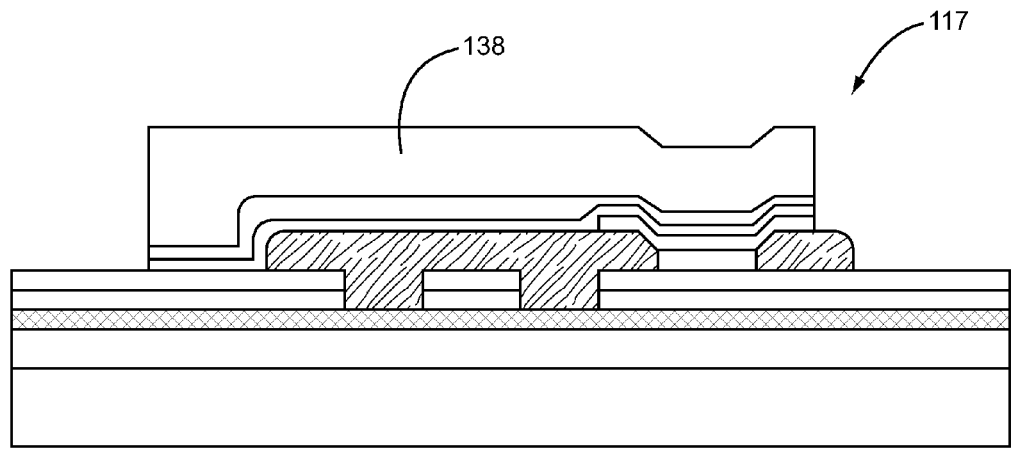
FIGS. 14A-14C illustrate steps in one embodiment of a method for manufacturing still another embodiment of a MEMS switch utilizing the first embodiment of the MEMS fabrication device.
Figure 14B:
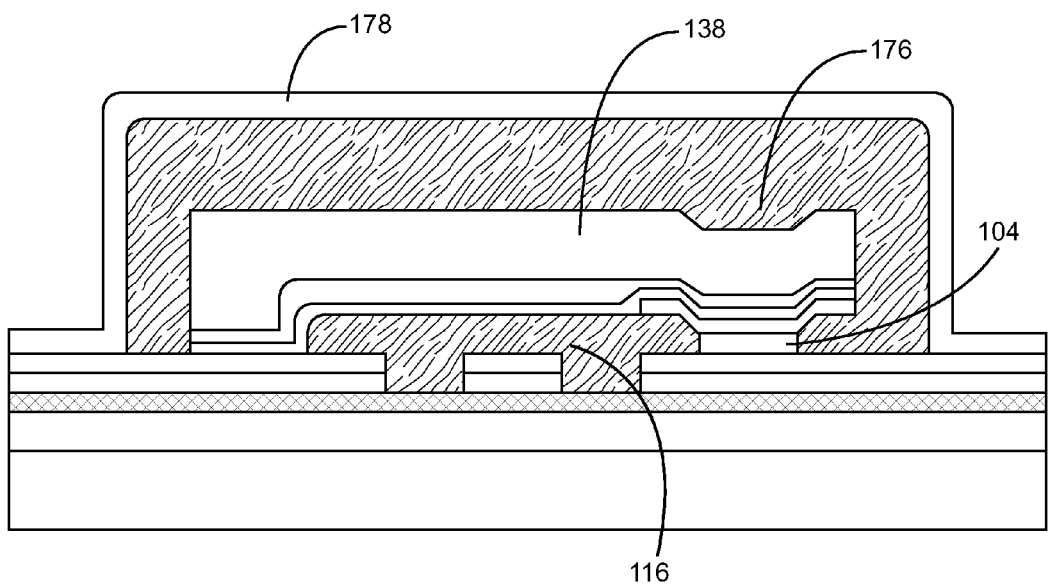
Figure 14C:
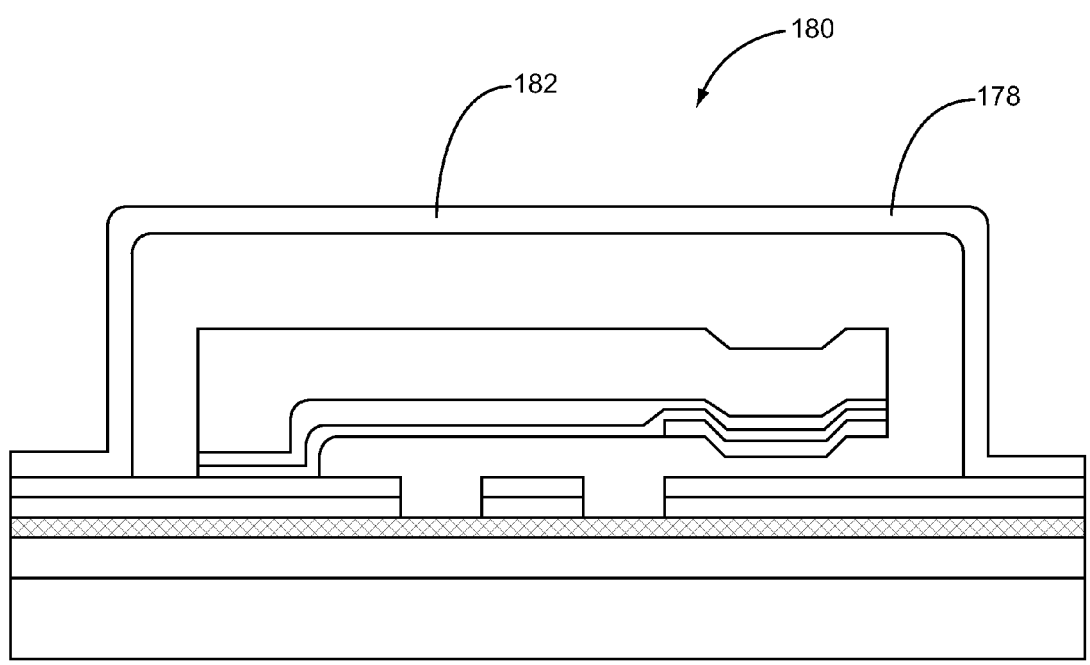

FIGS. 14A-14C illustrate steps for manufacturing another embodiment of a MEMS switch from the MEMS fabrication device 117. FIG. 14A illustrates the MEMS fabrication device 117 after the actuation member 138 has been formed as described above for FIGS. 9A-9F. Next, as shown in FIG. 14B, a third sacrificial layer 176 is coated and pattered over the actuation member 138. The third sacrificial layer 176 may be formed from the same or different material as the first sacrificial layer 116. An enclosure layer 178 is also placed over the third sacrificial layer 176 which may be made from a dielectric material. First, second, and third sacrificial layers 104, 116, 176 are removed to create the MEMS switch 180, as shown in FIG. 14C. MEMS switch 180 includes a dome 182 formed by the enclosure layer 178 which isolates the MEMS switch 180 from electromagnetic noise.

Figure 15:
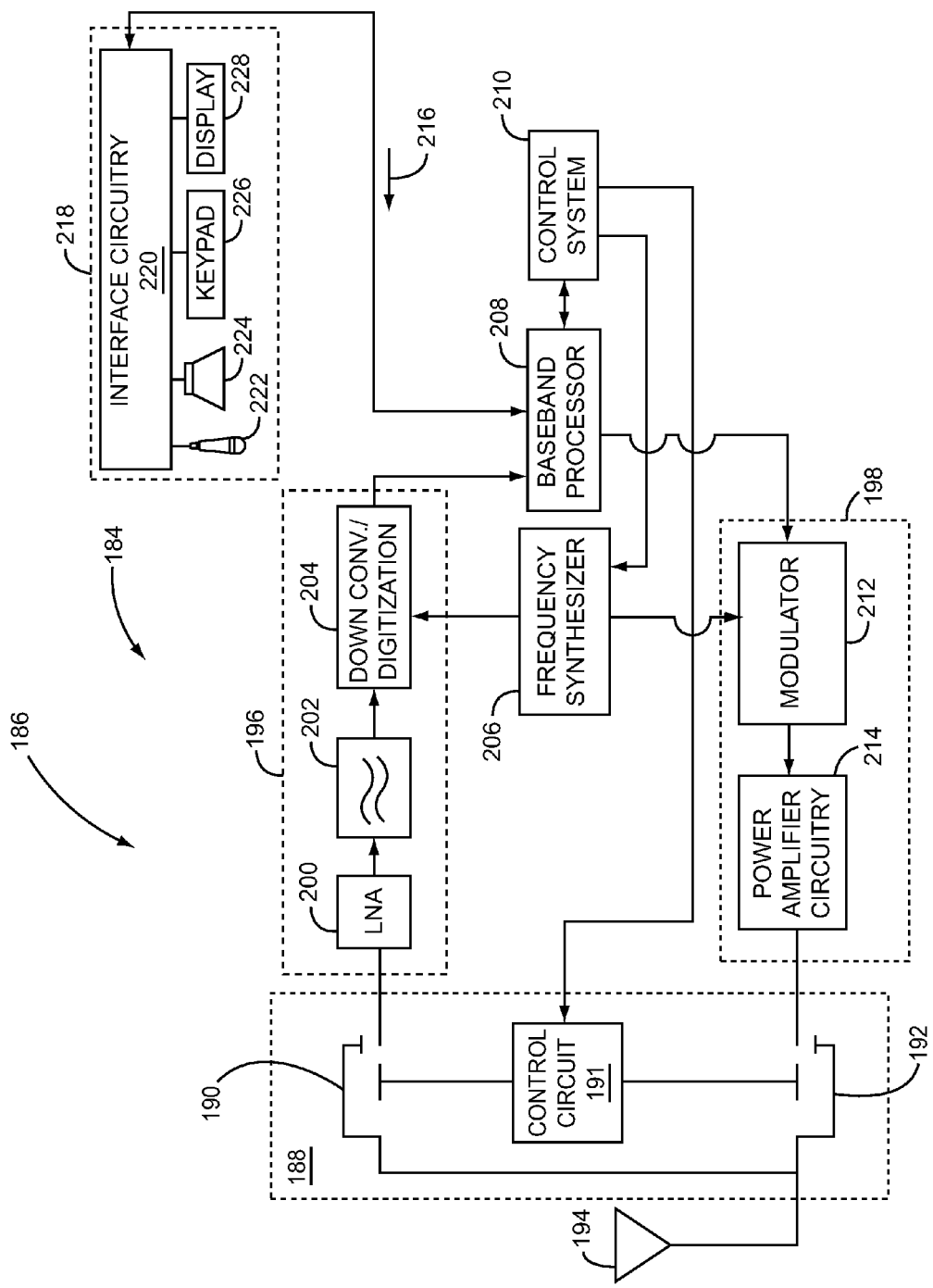
FIG. 15 illustrates one embodiment of a radio-frequency (RF) circuit utilizing MEMS switches.

FIG. 15 illustrates one application for MEMS switches manufactured from MEMS fabrication devices in accordance with the Disclosure. In FIG. 15, illustrates an RF circuit 184 which in this case is a transceiver 186 for a portable user device such as a mobile telephone. A front end 188 of the transceiver 186 includes MEMS switches 190, 192 and a control circuitry 191 that controls the opening and closing of MEMS switches 190, 192. An antenna 194 is coupled through a receive path to the receive MEMS switch 190 to receiver front end 196. Similarly, the radio-frequency transmitter section 198 is coupled to the antenna 194 through a transmit path including the transmit MEMS switch 192. When receiving, the receive MEMS switch 190 is closed, while the transmit MEMS switch 192 is open. When transmitting, the transmit MEMS switch 192 is closed, while the receive MEMS switch 190 is open. Thus, signals received by or transmitted from the antenna 194 are selectively routed between the receiver front end 196 and the radio frequency transmitter section 198 based on the receive or transmit mode. The control circuitry 191 controls the receive MEMS switch 190 and transmit MEMS switch 192 by providing a receive MEMS switch control signal and a transmit MEMS switch control signal.

The receiver front end 196 receives information bearing radio frequency signals of a given mode from one or more remote transmitters provided by a base station (not shown). A low noise amplifier 200 amplifies the signal. A filter circuit 202 minimizes broadband interference in the received signal, while down conversion and digitization circuitry 204 down converts the filtered, received signal to an intermediate or baseband frequency signal, which is then digitized into one or more digital streams. The receiver front end 196 typically uses one or more mixing frequencies generated by a frequency synthesizer 206.

The transceiver 186 further includes a baseband processor 208 and a control system 210. The control system 210 may include or cooperate with the control circuitry 191 to control and equalize the potentials across the MEMS switches 190, 192 during closing and opening.

The baseband processor 208 processes the digitized received signal to extract the information or data bits conveyed in the received signal. This processing typically comprises demodulation, decoding, and error correction operations. As such, the baseband processor 208 is generally implemented in one or more digital signal processors (DSPs).

On the transmit side, the baseband processor 208 receives digitized data, which may represent voice, data, or control information, from the control system 210, which it encodes for transmission. The encoded data is output to the radio frequency transmitter section 198, where it is used by modulation circuitry 212 to modulate a carrier signal that is at a desired transmit frequency for the given mode. Power amplifier circuitry 214 amplifies the modulated carrier signal to a level appropriate for transmission according to a power control signal, and delivers the amplified and modulated carrier signal to antenna 194 through the MEMS switch 192.

A user may interact with the transceiver 186 and transmit and receive user input/output signals 216 via the interface 218, which may include interface circuitry 220 for receiving, transmitting, and processing user input/output signals 216. Interface 218 may be generally associated with a microphone 222, a driving speaker 224, a keypad 226, and a display 228. The microphone 222 will typically convert audio input, such as the user's voice, into an user input/output signal 216, which is then digitized and passed directly or indirectly to the baseband processor 208. Audio information encoded in the user input/output signal 216 is recovered by the baseband processor 208, and converted by the interface circuitry 220 into an analog signal suitable for driving speaker 224. The keypad 226 and display 228 enable the user to interact with the transceiver 186.

Those skilled in the art will recognize improvements and modifications to the preferred embodiments of the present Disclosure. All such improvements and modifications are considered within the scope of the concepts disclosed herein and the claims that follow.

What is claimed is:

1. A method for manufacturing a micro-electromechanical system (MEMS) switch, comprising:
   providing a substrate;
   providing an actuator plate and a contact pad over the substrate;
   providing a first sacrificial layer over the contact pad;
   providing a second sacrificial layer over the actuator plate, the contact pad, and the first sacrificial layer;
   creating a recess in the second sacrificial layer to expose an area of the first sacrificial layer, wherein the area of the first sacrificial layer exposed by the recess is over the contact pad;
   forming an actuation member over the second sacrificial layer and within the recess on the area of the first sacrificial layer exposed by the recess; and
   removing the first and second sacrificial layers, wherein removing the first sacrificial layer comprises creating a contact gap between the actuation member and the contact pad.

2. The method of claim 1 wherein removing the first and second sacrificial layers comprises first removing the second sacrificial layer and then removing the first sacrificial layer.

3. The method of claim 1 for manufacturing the MEMS switch, further comprising forming the first sacrificial layer to be over only the contact pad.

4. The method of claim 1 for manufacturing the MEMS switch, wherein forming the actuation member over the second sacrificial layer and within the recess on the area of the first sacrificial layer exposed by the recess further comprises forming a contact portion of the actuation member within the recess on the area of the first sacrificial layer exposed by the recess.

5. The method of claim 4 for manufacturing the MEMS switch, wherein forming the actuation member over the second sacrificial layer and within the recess on the area of the first sacrificial layer exposed by the recess further comprises forming a contact area of the actuation member over and on the area of the first sacrificial layer exposed by the recess.

6. The method of claim 1 for manufacturing the MEMS switch, further comprising wherein the first sacrificial layer is provided so that when the actuation member is formed over the second sacrificial layer and within the recess on the area of the first sacrificial layer exposed by the recess, the first sacrificial layer is positioned in the contact gap between the actuation member and the contact pad.

7. The method of claim 1 for manufacturing the MEMS switch, further comprising providing an anchor pad over the substrate.

8. The method of claim 7 for manufacturing the MEMS switch, wherein forming the actuation member over the second sacrificial layer and within the recess on the area of the first sacrificial layer exposed by the recess comprises anchoring an end of the actuation member to the anchor pad.

9. The method of claim 1 for manufacturing the MEMS switch, wherein forming the actuation member over the second sacrificial layer and within the recess on the area of the first sacrificial layer exposed by the recess further comprises forming an arm of the actuation member over the actuator plate whereby the arm of the actuation member and the actuator plate define an actuator gap.

10. The method of claim 1 for manufacturing the MEMS switch, wherein providing the actuator plate and the contact pad over the substrate, further comprises:
    providing a conductive layer over the substrate; and
    forming the actuator plate and the contact pad from the conductive layer.

11. The method of claim 10 for manufacturing the MEMS switch, wherein providing the first sacrificial layer over the contact pad further comprises:
    providing the first sacrificial layer over the conductive layer; and
    removing portions of the first sacrificial layer that extend beyond the contact pad.

12. The method of claim 11 for manufacturing the MEMS switch wherein the first sacrificial layer is provided over the conductive layer prior to forming the actuator plate and the contact pad from the conductive layer.

13. The method of claim 11 for manufacturing the MEMS switch, wherein the actuator plate and the contact pad are formed from the conductive layer prior to providing the first sacrificial layer over the conductive layer.

14. The method of claim 10 for manufacturing the MEMS switch, further comprising:
    providing a hard conductive layer between the first sacrificial layer and the conductive layer; and
    forming a bump pad under the first sacrificial layer.

15. The method of claim 1 for manufacturing the MEMS switch, wherein forming the actuation member over the second sacrificial layer and within the recess on the area of the first sacrificial layer exposed by the recess further comprises:
   providing a hard conductive layer over at least the area of the first sacrificial layer exposed by the recess; and
   attaching the hard conductive layer to a contact portion of the actuation member.

16. The method of claim 1 for manufacturing the MEMS switch, wherein forming the actuation member over the second sacrificial layer and within the recess on the area of the first sacrificial layer exposed by the recess further comprises:
   providing a seed layer over the second sacrificial layer and within the recess on the area of the first sacrificial layer exposed by the recess; and
   electroplating conductive material over the seed layer to form the actuation member.

17. The method of claim 16 for manufacturing the MEMS switch wherein:
   providing the seed layer over the second sacrificial layer and within the recess on the area of the first sacrificial layer exposed by the recess comprises:
      providing an attachment layer over the area of the first sacrificial layer exposed by the recess and the second sacrificial layer; and
      providing a seed film over the attachment layer wherein the seed layer includes the seed film and the attachment layer.

18. The method of claim 17 for manufacturing the MEMS switch, further comprising:
   removing a portion of the attachment layer underneath at least a contact portion of the actuation member prior to removing the first and second sacrificial layers.

19. The method of claim 1 for manufacturing the MEMS switch, further comprising:
   providing a third sacrificial layer over the actuation member;
   providing an enclosure layer over the third sacrificial layer; and
   removing the third sacrificial layer wherein the enclosure layer forms a dome over the MEMS switch.

20. The method of claim 1, wherein the area of the first sacrificial layer exposed by the recess is substantially parallel to a contact area of the contact pad and over the contact area of the contact pad.

21. The method of claim 1 for manufacturing the MEMS switch, wherein the first sacrificial layer comprises a metal sacrificial layer.

22. The method of claim 21 for manufacturing the MEMS switch, wherein the second sacrificial layer comprises a polymer based sacrificial layer.

23. The method of claim 1 for manufacturing the MEMS switch, wherein the second sacrificial layer comprises a polymer based sacrificial layer.

24. A fabrication device for manufacturing a micro-electromechanical system (MEMS) switch, comprising:
   a substrate;
   an actuator plate and a contact pad over the substrate;
   a first sacrificial layer over the contact pad;
   a second sacrificial layer over the actuator plate and the contact pad, the second sacrificial layer comprising a recess wherein an area of the first sacrificial layer is exposed by the recess and the area of the first sacrificial layer exposed by the recess is over the contact pad; and
   an actuation member formed over the second sacrificial layer and having a contact portion formed within the recess on the area of the first sacrificial layer exposed by the recess, wherein a contact gap between the actuation member and the contact pad is defined by the first sacrificial layer.

25. The fabrication device of claim 24, wherein the actuation member further comprises a contact portion, wherein the contact portion of the actuation member is within the recess in the second sacrificial layer and on the area of the first sacrificial layer exposed by the recess.

26. The fabrication device of claim 25, wherein the contact portion further comprises a contact area, wherein the contact area of the contact portion is over and on the area of the first sacrificial layer exposed by the recess.

27. The fabrication device of claim 24, wherein the first sacrificial layer is positioned in the contact gap between the actuation member and the contact pad.

28. The fabrication device of claim 24, further comprising an anchor pad over the substrate.

29. The fabrication device of claim 28, wherein an anchored end of the actuation member is attached to the anchor pad.

30. The fabrication device of claim 24, wherein the area of the first sacrificial layer exposed by the recess is substantially parallel to a contact area of the contact pad and over the contact area of the contact pad.

31. The fabrication device of claim 24, wherein the first sacrificial layer comprises a metal sacrificial layer.

32. The fabrication device of claim 31, wherein the second sacrificial layer comprises a polymer based sacrificial layer.

33. The fabrication device of claim 24, wherein the second sacrificial layer comprises a polymer based sacrificial layer.

* * * * *